United States Patent [19]

Plambeck

[11] Patent Number: 5,610,603
[45] Date of Patent: Mar. 11, 1997

[54] SORT ORDER PRESERVATION METHOD USED WITH A STATIC COMPRESSION DICTIONARY HAVING CONSECUTIVELY NUMBERED CHILDREN OF A PARENT

[75] Inventor: Kenneth E. Plambeck, Poughkeepsie, N.Y.

[73] Assignee: International Business Machines Corporation, Armonk, N.Y.

[21] Appl. No.: 535,509

[22] Filed: Sep. 28, 1995

[51] Int. Cl.⁶ .................................................. H03M 7/30
[52] U.S. Cl. ............................ 341/51; 341/59; 341/106; 341/87
[58] Field of Search ................................. 341/50, 51, 59, 341/63, 87, 95, 106

Primary Examiner—Jeffrey A. Gaffin
Assistant Examiner—Jason H. Vick
Attorney, Agent, or Firm—Bernard M. Goldman

[57] ABSTRACT

A method of performing Ziv-Lempel type data compression while preserving in the compressed records any sort ordering of the uncompressed records. The method assigns the necessary ordered numbering to the code words for character strings in a static compression dictionary even though the dictionary is structured so that all children of the same parent have sequential index numbering. The children of a parent are in collating sequence order, and adjacent children that are nonadjacent in the collating sequence have a conceptual epsilon entry between them, which entry represents a match on the parent and a direction in the collating sequence. Code words for actual children are formed by using a dictionary entry index to locate a translation table entry containing a code word. Code words for epsilon entries are formed by using an entry index for an actual child to locate a translation table entry and then adding or subtracting one to or from the code word in the entry.

15 Claims, 15 Drawing Sheets

| SOURCE STRING | CODE FIG.1 | CODE FIG.2 | SOURCE STRING | CODE FIG.1 | CODE FIG.2 | SOURCE STRING | CODE FIG.1 | CODE FIG.2 |
|---|---|---|---|---|---|---|---|---|
| A | 1 | 1 | B | 4 | 5,0 | C | 5 | 6,0 |
| AA | 2 | 2,0 | B,A | 4,1 | 5,1 | C,A | 5,1 | 6,1 |
| AA,A | 2,1 | 2,1 | B,AA | 4,2 | 5,2,0 | C,AA | 5,2 | 6,2,0 |
| AA,B | 2,4 | 2,5,0 | B,A,B | 4,1,4 | 5,3,5,0 | C,A,B | 5,1,4 | 6,3,5,0 |
| AA,C | 2,5 | 2,6,0 | B,A,C | 4,1,5 | 5,4,0 | C,AC | 5,1,5 | 6,4,0 |
| A,B | 1,4 | 3,5,0 | B,B | 4,4 | 5,5,0 | CB | 6 | 7,0 |
| A,B,A | 1,4,1 | 3,5,1 | B,B,A | 4,4,1 | 5,5,1 | CB,A | 6,1 | 7,1 |
| A,B,B | 1,4,4 | 3,5,5,0 | B,B,B | 4,4,4 | 5,5,5,0 | CB,B | 6,4 | 7,5,0 |
| A,B,C | 1,4,5 | 3,5,6,0 | B,B,C | 4,4,5 | 5,5,6,0 | CB,C | 6,5 | 7,6,0 |
| AC | 3 | 4,0 | B,C | 4,5 | 5,6,0 | C,C | 5,5 | 8,6,0 |
| AC,A | 3,1 | 4,1 | B,C,A | 4,5,1 | 5,6,1 | C,C,A | 5,5,1 | 8,6,1 |
| AC,B | 3,4 | 4,5,0 | B,CB | 4,6 | 5,7,0 | C,CB | 5,5,4 | 8,7,0 |
| AC,C | 3,5 | 4,6,0 | B,C,C | 4,5,5 | 5,8,6,0 | C,C,C | 5,5,5 | 8,8,6,0 |

COMPRESSION DICTIONARY CHARACTER ENTRIES

IF CCT=0

| CCT | | ACT | | [EC] | ... | ... | ... | |
|---|---|---|---|---|---|---|---|---|
| 0 | 3 | 8 | 11 | 24 | 32 | 40 | 48 | 56 63 |

IF CCT=1

| CCT | X | | ACT | CPTR | [EC] | ... | CC | | |
|---|---|---|---|---|---|---|---|---|---|
| 0 | 3 | 4 | 8 | 11 | 24 | | N | | 63 |

IF CCT>1

| CCT | XXXXX | YY | D | CPTR | [EC] | CC | CC | ... | ... |
|---|---|---|---|---|---|---|---|---|---|
| 0 | 3 | | 8 | 11 | 24 | N | N+8 | | 63 |

FIG.6
Prior Art

SIBLING DESCRIPTOR

| SCT | YYYYY | SC | [SC] | ... | ... | ... | ... | ... |
|---|---|---|---|---|---|---|---|---|
| 0 | 3 | 8 | 16 | 24 | 32 | 40 | 48 | 56 63 |

FIG.7
Prior Art

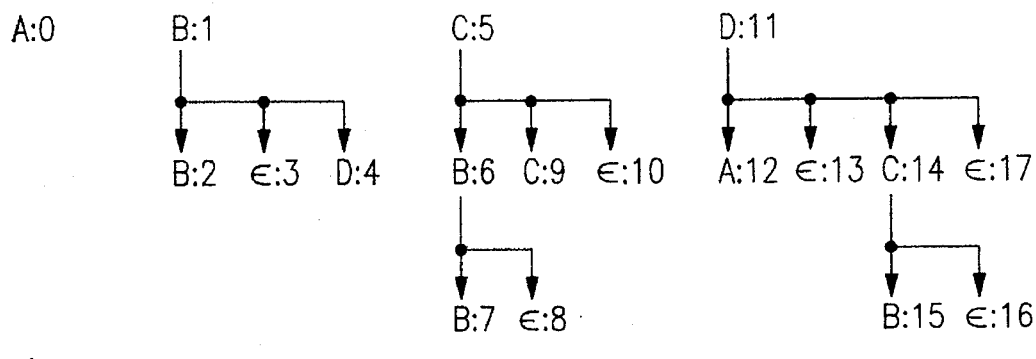
FIG.14
| SOURCE STRING | CODE | SOURCE STRING | CODE | SOURCE STRING | CODE |
|---|---|---|---|---|---|
| A | 0 | B | 1 | CB | 6 |
| A,B | 0,1 | B,A | 1,0 | CBB | 7 |
| A,B,C | 0,3,5 | B,A,C | 1,0,5 | CB,C | 8,5 |
| A,B,C,D | 0,3,10,11 | B,A,C,D | 1,0,10,11 | CB,CC | 8,9 |
| A,BD,C | 0,4,5 | BB | 2 | CB,C,D | 8,10,11 |
| A,CB,D | 0,8,11 | BB,B | 2,1 | CC,CC | 9,9 |
| A,C,D,B | 0,10,13,1 | BB,C | 2,5 | CC,C,D | 9,10,11 |
| A,D,B,C | 0,13,3,5 | BB,CC | 2,9 | C,D,B,A | 10,13,1,0 |
| A,DCB | 0,15 | BB,C,D | 2,10,11 | C,D,BD | 10,13,4 |
FIG.15
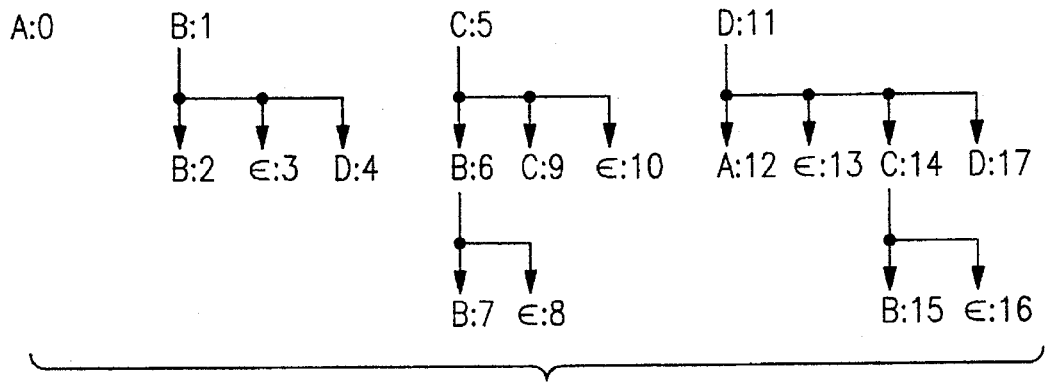
FIG.16

COMPRESSION CALL (CMPSC)

CONDITION CODES:
    CC0 IF END OF SOURCE OPERAND REACHED.
    CC1 IF END OF DESTINATION OPERAND REACHED, AND END OF SOURCE OPERAND NOT REACHED.

O:   ORDER PRESERVATION

CDDS: COMPRESSED DATA SYMBOL SIZE

E:   EXPANSION OPERATION

STT OFF: SYMBOL TRANSLATION TABLE OFFSET

CBN:   COMPRESSED DATA BIT NUMBER

SYMBOL TRANSLATION TABLE

| | |
|---|---|
| 0 | 0 |
| 1 | 1 |
| 2 | 5 |
| 3 | 11 |
| 4 | 2 |
| 5 | 4 |
| 6 | 7 |
| 7 | 6 |
| 8 | 9 |
| 9 | 15 |
| 10 | 12 |
| 11 | 14 |
| 12 | 17 |

| INTER-CHANGE SYMBOL | CHARACTER SYMBOL | CORRESPONDS TO ∈ NODE |
|---|---|---|
| 0 | A | |
| 1 | B | |
| 2 | BB | |
| 3 | B | YES |
| 4 | BD | |
| 5 | C | |
| 6 | CB | |
| 7 | CBB | |
| 8 | CB | YES |
| 9 | CC | |
| 10 | C | YES |
| 11 | D | |
| 12 | DA | |
| 13 | D | YES |
| 14 | DC | |
| 15 | DCB | |
| 16 | DC | YES |
| 17 | D | |

| SOURCE STRING | CODE | SOURCE STRING | CODE | SOURCE STRING | CODE | SOURCE STRING | CODE |
|---|---|---|---|---|---|---|---|
| A | 0 | | | B | 1 | | |
| A,A | 0,0 | A,C | 0,5 | B,A | 1,0 | B,C | 3,5 |
| A,A,A | 0,0,0 | A,C,A | 0,5,0 | B,A,A | 1,0,0 | B,C,A | 3,5,0 |
| A,A,A,A | 0,0,0,0 | A,C,A,A | 0,5,0,0 | B,A,A,A | 1,0,0,0 | B,C,A,A | 3,5,0,0 |
| A,A,A,B | 0,0,0,1 | A,C,A,B | 0,5,0,1 | B,A,A,B | 1,0,0,1 | B,C,A,B | 3,5,0,1 |
| A,A,A,C | 0,0,0,5 | A,C,A,C | 0,5,0,5 | B,A,A,C | 1,0,0,5 | B,C,A,C | 3,5,0,5 |
| A,A,A,D | 0,0,0,11 | A,C,A,D | 0,5,0,11 | B,A,A,D | 1,0,0,11 | B,C,A,D | 3,5,0,11 |
| A,A,B | 0,0,1 | A,CB | 0,6 | B,A,B | 1,0,1 | B,CB | 3,6 |
| A,A,B,A | 0,0,1,0 | A,CB,A | 0,6,0 | B,A,B,A | 1,0,1,0 | B,CB,A | 3,6,0 |
| A,A,BB | 0,0,2 | A,CBB | 0,7 | B,A,BB | 1,0,2 | B,CBB | 3,7 |
| A,A,B,C | 0,0,3,5 | A,CB,C | 0,8,5 | B,A,B,C | 1,0,3,5 | B,CB,C | 3,8,5 |
| A,A,BD | 0,0,4 | A,CB,D | 0,8,11 | B,A,BD | 1,0,4 | B,CB,D | 3,8,11 |
| A,A,C | 0,0,5 | A,CC | 0,9 | B,A,C | 1,0,5 | B,CC | 3,9 |
| A,A,C,A | 0,0,5,0 | A,CC,A | 0,9,0 | B,A,C,A | 1,0,5,0 | B,CC,A | 3,9,0 |
| A,A,CB | 0,0,6 | A,CC,B | 0,9,1 | B,A,CB | 1,0,6 | B,CC,B | 3,9,1 |
| A,A,CC | 0,0,9 | A,CC,C | 0,9,5 | B,A,CC | 1,0,9 | B,CC,C | 3,9,5 |
| A,A,C,D | 0,0,10,11 | A,CC,D | 0,9,11 | B,A,C,D | 1,0,10,11 | B,CC,D | 3,9,11 |
| A,A,D | 0,0,11 | A,C,D | 0,10,11 | B,A,D, | 1,0,11 | B,C,D | 3,10,11 |
| A,A,DA | 0,0,12 | A,C,DA | 0,10,12 | B,A,DA | 1,0,12 | B,C,DA | 3,10,12 |
| A,A,D,B | 0,0,13,1 | A,C,D,B | 0,10,13,1 | B,A,D,B | 1,0,13,1 | B,C,D,B | 3,10,13,1 |
| A,A,DC | 0,0,14 | A,C,DC | 0,10,14 | B,A,DC | 1,0,14 | B,C,DC | 3,10,14 |
| A,A,DD | 0,0,17 | A,C,DD | 0,10,17 | B,A,DD | 1,0,17 | B,C,DD | 3,10,17 |
| A,B | 0,1 | A,D | 0,11 | BB | 2 | BD | 4 |
| A,B,A | 0,1,0 | A,DA | 0,12 | BB,A | 2,0 | BD,A | 4,0 |
| A,B,A,A | 0,1,0,0 | A,DA,A | 0,12,0 | BB,A,A | 2,0,0 | BD,A,A | 4,0,0 |
| A,B,A,B | 0,1,0,1 | A,DA,B | 0,12,1 | BB,A,B | 2,0,1 | BD,A,B | 4,0,1 |
| A,B,A,C | 0,1,0,5 | A,DA,C | 0,12,5 | BB,A,C | 2,0,5 | BD,A,C | 4,0,5 |
| A,B,A,D | 0,1,0,11 | A,DA,D | 0,12,11 | BB,A,D | 2,0,11 | B,DA,D | 4,0,11 |
| A,BB | 0,2 | A,D,B | 0,13,1 | BB,B | 2,1 | BD,B | 4,1 |
| A,BB,A | 0,2,0 | A,D,B,A | 0,13,1,0 | BB,B,A | 2,1,0 | BD,B,A | 4,1,0 |
| A,BB,B | 0,2,1 | A,D,BB | 0,13,2 | BB,BB | 2,2 | BD,BB | 4,2 |
| A,BB,C | 0,2,5 | A,D,B,C | 0,13,3,5 | BB,B,C | 2,3,5 | BD,B,C | 4,3,5 |
| A,BB,D | 0,2,11 | A,D,BD | 0,13,4 | BB,BD | 2,4 | BD,BD | 4,4 |
| A,B,C | 0,3,5 | A,DC | 0,14 | BB,C | 2,5 | BD,C | 4,5 |
| A,B,C,A | 0,3,5,0 | A,DC,A | 0,14,0 | BB,C,A | 2,5,0 | BD,C,A | 4,5,0 |
| A,B,CB | 0,3,6 | A,DCB | 0,15 | BB,CB | 2,6 | BD,CB | 4,6 |
| A,B,CC | 0,3,9 | A,DC,C | 0,16,5 | BB,CC | 2,9 | BD,CC | 4,9 |
| A,B,C,D | 0,3,10,11 | A,DC,D | 0,16,11 | BB,C,D | 2,10,11 | BD,C,D | 4,10,11 |
| A,BD | 0,4 | A,DD | 0,17 | BB,D | 2,11 | BD,D | 4,11 |
| A,BD,A | 0,4,0 | A,DD,A | 0,17,0 | BB,DA | 2,12 | BD,DA | 4,12 |
| A,BD,B | 0,4,1 | A,DD,B | 0,17,1 | BB,D,B | 2,13,1 | BD,D,B | 4,13,1 |
| A,BD,C | 0,4,5 | A,DD,C | 0,17,5 | BB,DC | 2,14 | BD,DC | 4,14 |
| A,BD,D | 0,4,11 | A,DD,D | 0,17,11 | BB,DD | 2,17 | BD,DD | 4,17 |

FIG.24A

| SOURCE STRING | CODE | SOURCE STRING | CODE | SOURCE STRING | CODE | SOURCE STRING | CODE |
|---|---|---|---|---|---|---|---|
| C | 5 | | | D | 11 | | |
| C,A | 5,0 | CC | 9 | DA | 12 | DC | 14 |
| C,A,A | 5,0,0 | CC,A | 9,0 | DA,A | 12,0 | DC,A | 14,0 |
| C,A,A,A | 5,0,0,0 | CC,A,A | 9,0,0 | DA,A,A | 12,0,0 | DC,A,A | 14,0,0 |
| C,A,A,B | 5,0,0,1 | CC,A,B | 9,0,1 | DA,A,B | 12,0,1 | DC,A,B | 14,0,1 |
| C,A,A,C | 5,0,0,5 | CC,A,C | 9,0,5 | DA,A,C | 12,0,5 | DC,A,C | 14,0,5 |
| C,A,A,D | 5,0,0,11 | CC,A,D | 9,0,11 | DA,A,D | 12,0,11 | DC,A,D | 14,0,11 |
| C,A,B | 5,0,1 | CC,B | 9,1 | DA,B | 12,1 | DCB | 15 |
| C,A,B,A | 5,0,1,0 | CC,B,A | 9,1,0 | DA,B,A | 12,1,0 | DCB,A | 15,0 |
| C,A,BB | 5,0,2 | CC,BB | 9,2 | DA,BB | 12,2 | DCB,B | 15,1 |
| C,A,B,C | 5,0,3,5 | CC,B,C | 9,3,5 | DA,B,C | 12,3,5 | DCB,C | 15,5 |
| C,A,BD | 5,0,4 | CC,BD | 9,4 | DA,BD | 12,4 | DCB,D | 15,11 |
| C,A,C | 5,0,5 | CC,C | 9,5 | DA,C | 12,5 | DC,C | 16,5 |
| C,A,C,A | 5,0,5,0 | CC,C,A | 9,5,0 | DA,C,A | 12,5,0 | DC,C,A | 16,5,0 |
| C,A,CB | 5,0,6 | CC,CB | 9,6 | DA,CB | 12,6 | DC,CB | 16,6 |
| C,A,CC | 5,0,9 | CC,CC | 9,9 | DA,CC | 12,9 | DC,CC | 16,9 |
| C,A,C,D | 5,0,10,11 | CC,C,D | 9,10,11 | DA,C,D | 12,10,11 | DC,C,D | 16,10,11 |
| C,A,D | 5,0,11 | CC,D | 9,11 | DA,D | 12,11 | DC,D | 16,11 |
| C,A,DA | 5,0,12 | CC,DA | 9,12 | DA,DA | 12,12 | DC,DA | 16,12 |
| C,A,D,B | 5,0,13,1 | CC,D,B | 9,13,1 | DA,D,B | 12,13,1 | DC,D,B | 16,13,1 |
| C,A,DC | 5,0,14 | CC,DC | 9,14 | DA,DC | 12,14 | DC,DC | 16,14 |
| C,A,DD | 5,0,17 | CC,DD | 9,17 | DA,DD | 12,17 | DC,DD | 16,17 |
| CB | 6 | C,D | 10,11 | D,B | 13,1 | DD | 17 |
| CB,A | 6,0 | C,DA | 10,12 | D,B,A | 13,1,0 | DD,A | 17,0 |
| CB,A,A | 6,0,0 | C,DA,A | 10,12,0 | D,B,A,A | 13,1,0,0 | DD,A,A | 17,0,0 |
| CB,A,B | 6,0,1 | C,DA,B | 10,12,1 | D,B,A,B | 13,1,0,1 | DD,A,B | 17,0,1 |
| CB,A,C | 6,0,5 | C,DA,C | 10,12,5 | D,B,A,C | 13,1,0,5 | DD,A,C | 17,0,5 |
| CB,A,D | 6,0,11 | C,DA,D | 10,12,11 | D,B,A,D | 13,1,0,11 | DD,A,D | 17,0,11 |
| CBB | 7 | C,D,B | 10,13,1 | D,BB | 13,2 | DD,B | 17,1 |
| CBB,A | 7,0 | C,D,B,A | 10,13,1,0 | D,BB,A | 13,2,0 | DD,B,A | 17,1,0 |
| CBB,B | 7,1 | C,D,BB | 10,13,2 | D,BB,B | 13,2,1 | DD,BB | 17,2 |
| CBB,C | 7,5 | C,D,B,C | 10,13,3,5 | D,BB,C | 13,2,5 | DD,B,C | 17,3,5 |
| CBB,D | 7,11 | C,D,BD | 10,13,4 | D,BB,D | 13,2,11 | DD,BD | 17,4 |
| CB,C | 8,5 | C,DC | 10,14 | D,B,C | 13,3,5 | DD,C | 17,5 |
| CB,C,A | 8,5,0 | C,DC,A | 10,14,0 | D,B,C,A | 13,3,5,0 | DD,C,A | 17,5,0 |
| CB,CB | 8,6 | C,DCB | 10,15 | D,B,CB | 13,3,6 | DD,CB | 17,6 |
| CB,CC | 8,9 | C,DC,C | 10,16,5 | D,B,CC | 13,3,9 | DD,CC | 17,9 |
| CB,C,D | 8,10,11 | C,DC,D | 10,16,11 | D,B,C,D | 13,3,10,11 | DD,C,D | 17,10,11 |
| CB,D | 8,11 | C,DD | 10,17 | D,BD | 13,4 | DD,D | 17,11 |
| CB,DA | 8,12 | C,DD,A | 10,17,0 | D,DB,A | 13,4,0 | DD,DA | 17,12 |
| CB,D,B | 8,13,1 | C,DD,B | 10,17,1 | D,DB,B | 13,4,1 | DD,D,B | 17,13,1 |
| CB,DC | 8,14 | C,DD,C | 10,17,5 | D,DB,C | 13,4,5 | DD,DC | 17,14 |
| CB,DD | 8,17 | C,DD,D | 10,17,11 | D,DB,D | 13,4,11 | DD,DD | 17,17 |

FIG.24B

SORT ORDER PRESERVATION METHOD USED WITH A STATIC COMPRESSION DICTIONARY HAVING CONSECUTIVELY NUMBERED CHILDREN OF A PARENT

BACKGROUND OF THE INVENTION

Data compression while preserving sort ordering makes practicable the compression of certain types of data. For example, the data in a data base may consist of two thirds data records and one third keys corresponding to the data records. The keys are normally processed extensively by means of less than, equal to, or greater than comparisons in order to locate corresponding records. While the data records often are compressed to save space, the keys are commonly not compressed because of the processing time that would be required to uncompress them in order to do said comparisons. If the same said comparisons could be done on compressed keys as on uncompressed keys, it would be practicable to compress the keys in order to save space beyond that saved by compressing just the data records, and it would also reduce processing time because the compressed keys would be shorter than the uncompressed keys.

Said comparisons can be done on compressed keys if the sort ordering of the keys has been preserved, that is, if a first compressed key has a lower value than a second compressed key when the corresponding first uncompressed key is lower in the collating sequence than the second uncompressed key.

Data compression has been done in the prior art by means of a Ziv-Lempel (ZL) method and a ZL dictionary, which are introduced as follows:

Ziv-Lempel (ZL) compression compares the next characters from an input data stream to strings in a dictionary until the longest matching string is found, and the method then outputs a code for the string, usually an index of the position of the string in the dictionary. In adaptive ZL dictionaries when each longest matching string is found, a new string consisting of the matched string plus one or more additional characters is added into the dictionary. The adaptive process is such that it can be repeated during expansion, provided that the data is expanded in the order in which it was compressed. An adaptive dictionary may grow without bounds, which increases the number of bits needed to express its indices; may grow to a predetermined size, after which it stops being adapted; or may have entries deleted from it to make room for new entries, with the deletion commonly being done by a least-recently-used algorithm. There are various ways of representing a dictionary in storage.

An article entitled "Compression of Individual Sequences via Variable Rate Coding," by Ziv and Lempel, published in Sep., 1978 in the IEEE Transactions of Information Theory, Vol. IT-24, No. 5, pages 530–536, discloses the basic Ziv-Lempel algorithm. A dictionary begins with a single null entry. When the longest string S that matches the next characters from the input is found in the dictionary, then a new entry S+c is formed, where c is the input character after the string that matched S, a code for S and the uncompressed character c are emitted as output data, and matching of input characters is resumed beginning at the input character after c. There is the disadvantage that the c characters in the output data are not compressed.

U.S. Pat. No. 4,464,650 to Willard L. Eastman, et al, issued Aug. 7, 1984, discloses an initially null dictionary (called a search tree) in which, after a match on S, a new entry S+c is formed, with matching then resumed at the character after c. Characters of an alphabet of predetermined size are assigned position numbers in accordance with the order in which the characters are first encountered. A new dictionary entry is assigned the next available entry number (called a label), and the next available alphabet-sized set of indices (called virtual addresses) is assigned to the positionally ordered possible future dependent entries of the new entry S+c. The jth potential child of node i has the index iA−(A−j)+1, where A is the number of characters in the alphabet. For example, with a four-character alphabet, the null root node has number and index 1, and its four potential children have the indices 2–5. A child will be assigned a number if and when the child is created. A hash table correlates entry numbers to indices during compression or indices to entry numbers during expansion.

When S is matched and entry S+c is formed, a coded form of the index of S+c is emitted, and a coded form of c is emitted if this is the first encountering of c. A coded form of c is not required to be emitted if c has already been encountered because then c is determinable from the index of S+c. Note that the dictionary has many more indices than nodes, which is why encoding of the indices is required.

U.S. Pat. No. 4,558,302 to Terry A. Welch, issued Dec. 10, 1985, discloses a dictionary that optionally may be initialized with all characters of an alphabet (and it is assumed here that it is so initialized). After a match on S, a new entry S+c is formed, with matching then resumed AT c. The index of S is emitted, but c is not emitted since the value of c will be known by means of the index of the next match since c will be the first character of the next match. A dictionary entry contains simply the index of a prefix (S) and an extension character (c).

During compression, the index of entry S+c is found by hashing the index for S and the character c. During expansion, when entry S+c is identified by an index in the compressed data, c is extracted from the S+c entry, and then the index of S in the S+c entry is used to access the S entry; hashing is not required during expansion. U.S. Pat. No. 4,464,650 (Eastman) is cited as being unsuitable for high-performance implementations because of utilizing time consuming and complex mathematical procedures such as multiplication and division to effect compression and expansion (column 3, line 44).

U.S. Pat. No. 4,814,746 to Victor S. Miller, et al, issued Mar. 21, 1989, assigned to the same assignee as the present application, discloses similarly to U.S. Pat. No. 4,558,302 (Welch) and also discloses elimination of dictionary entries, to make room for new entries, by means of a least-recently-used algorithm that may delete entries having no dependent entries (leaves of the tree that is the dictionary). The Miller patent also discloses formation of a new entry from S'+S, where S is the current match and S' is the previous match. After a match on S, matching is resumed at the character following S in the input data stream. Formation from S'+S hastens adaptation to long strings. The embodiment includes a discriminator tree and an array of strings that is the actual dictionary.

An entry in the string array represents either a single character (it contains the character) or S'+S (it contains pointers to the S' and S entries).

A node in the discriminator tree points to a string array entry and contains the length of the represented string. The discriminator tree is traversed during matching by hashing the current node and the next input character after the string whose length is given by the current node. A final match may be on either the array entry designated by a discriminator node or the S' prefix of that entry.

A system in which a child node (child) always represents only one extension character (a character on the right of the prefix represented by the parent) is called character extension. A system in which a child may represent multiple extension characters is called symbol extension.

European Patent Application 350,281 by Alan D. Clark, filed Jul. 4, 1989, forms a new entry from S+c and structures the dictionary as a tree. It discloses a down pointer in a parent node to the first child of the parent, a right pointer in a child to the next sibling of the child, and a parent pointer in each child to the parent of the child, with the parent pointer necessary only for expansion.

A paper by H. D. Jacobson, titled "Some Measured Performance Bounds and Implementation Considerations for the Lempel-Ziv-Welch Data Compaction Algorithm," in International Telemetering Conference Proceedings v 28 1992, published by International Foundation for Telemetering, Woodland Hills, Calif., describes a character extension 2K-entry dictionary structured as a 2K times 256 array of 11-bit entries. This structure permits any of 256 possible child nodes of a parent node, each child representing a different extension character, immediately to be tested for existence and located.

All of the above referenced patents and paper pertain to an adaptive dictionary that is useful for compressing and expanding long sequential data streams for either archiving or network transmission. Data must be expanded in the order in which it was compressed so that the dictionary during expansion will have, for each string processed, the same contents it had during compression.

U.S. Pat. No. 5,087,913 to Willard L. Eastman, issued Feb. 11, 1992, uses the same dictionary (search tree) and adaptive entry formation processing as in the above referenced U.S. Pat. No. 4,464,650 (Eastman), but it discloses entry formation by a preprocessor from a sample of the data to be compressed, and then freezing of the dictionary (no further adaptation) when either the sample is exhausted or the storage space for the dictionary is full. The advantage is that after an input data stream has been compressed, individual short records in the compressed data can be expanded and examined and possibly changed and recompressed in random order, which is appropriate for a data base of records that are constantly being read and updated in random order.

U.S. Pat. No. 5,270,712 to B. Iyer, et al, issued Dec. 14, 1993, entitled "Sort Order Preserving Method for Data Storage Compression," assigned to the same assignee as the present application, teaches a sort order preserving method for a ZL type dictionary, and this patent is incorporated by reference herein in its entirety.

FIG. 1 herein shows art prior to U.S. Pat. No. 5,270,712. It shows a dictionary tree based on only the character symbols A, B, and C. It shows the following character strings in the dictionary, listed in sort order: A, AA, AC, B, C, and CB. It shows a code word assigned to each of those strings (code word 1 to A, 2 to AA, etc.) The code words assigned retain the sort order of the individual dictionary strings but result in loss of sort order for longer strings of concatenated dictionary strings. For example, the string AAA (not in the dictionary of FIG. 1) precedes a string ABA (also not in the dictionary) in sort order, but AAA parses, using the FIG. 1 dictionary, as AA and A resulting in code words 2 and 1 (represented as 2,1), while ABA parses as A, B, and A resulting in code words 1, 4, and 1, and, thus, the code word sequence for AAA (2,1) is higher in the sort order than that for ABA (1,4,1).

It should be noted that the method of determining the sort order of code word sequences is the same as for character strings and is as follows: Beginning at the beginning of the sequences (or strings), compare one element (code word) of one sequence to the corresponding element of the other sequence. If the two elements are equal, move on to the next pair of elements and repeat the comparison. If one element is missing because its sequence has ended, or if one element is lower than the other, the sequence having the missing or lower element is lower in the sort order.

FIG. 2 shows the solution to the code word sequence problem, described for FIG. 1, according to the method of U.S. Pat. No. 5,270,712. Code words are not assigned to interior nodes of the tree, only to leaf nodes. Nodes representing end of record (EOR) and other nodes representing a fictitious Zil-symbol (or "Zilch," represented as Z) are added to the tree. An EOR or Zilch is placed as the first child of each interior and root node. If the first-ordered symbol of the source alphabet is present as a child node, then the left-most child is designated as EOR, or otherwise as Zilch. If two adjacent children are assigned source symbols that are non-adjacent in the source alphabet, then these nodes are separated by a new Zilch node. Besides showing a tree, FIG. 2 also shows the meaning of all of the code words when they are encountered by a decoder during an expansion process.

The Zilch holds the proper position of the code word sequence so that, when followed with the next source character, which appears as the first character down from the root of the tree, the code word sequence will retain sort order.

FIG. 3 shows the encoding of the first 39 possible source strings of the A, B, and C alphabet when either the tree of FIG. 1 or the tree of FIG. 2 is used. Commas are used to separate the characters of a source string that are parsed together because of the strings available in each tree, and they are also used to separate the corresponding code words that are generated as a result of the parsing. It can be seen that the FIG. 1 codes do not retain sort order in all cases while those of FIG. 2 do.

U.S. Pat. No. 5,442,350, issued Aug. 15, 1995 to B. Iyer, et al, entitled "Method and Means Providing Static Dictionary Structures for Compressing Character Data and Expanding Compressed Data," assigned to the same assignee as the present application, discloses novel structures of separate static compression and expansion dictionaries, and it discloses compression and expansion processing that uses those structures. U.S. Pat. No. 5,442,350 is herein incorporated by reference in its entirety. Because the preferred embodiment of the present application is attuned to the requirements and capabilities of the separate dictionaries of the preferred embodiment of U.S. Pat. No. 5,442,350, that preferred embodiment will now be briefly described in some detail.

The dictionaries of U.S. Pat. No. 5,442,350 are structured as nodes of a downward growing tree stemming from an imaginary null root entry. The actual 256 topmost entries are children of the root entry, are numbered 0 through 255, and are called alphabet entries, with each alphabet entry representing the character whose code is the number of the entry. Each alphabet entry may be a parent entry (parent) having one or more child entries, with each child representing one or more additional characters. Each of those children may in turn be a parent, etc. The one or more characters represented by each entry are called extension characters since they are extensions on the right of the characters represented by the entries in the path from the subject entry up to the root of the tree.

Compression of an input character string is accomplished by using the value (the code) of the first character of the string as a number to locate the identically numbered alphabet entry, then matching the further characters of the string to the extension characters represented by the descendents of the alphabet entry until the last possible match is found, and then outputting as the compressed data the number, called an index, of the last matching entry. A dictionary has some power-of-2 number of entries, and the index of an entry is a bit string of a length equal to the power. For example, the index of an entry in a 4K-entry (4,096-entry) dictionary is 12 bits. With this example dictionary, an input string consisting of some number (the number determined by the last possible match) of eight-bit characters can be compressed to one 12-bit index. However, in the worst case, when the last possible match is on only the alphabet entry, the compressed data is actually larger than the input data since the number of the alphabet entry must be expressed as a 12-bit index.

The entries in the dictionary described above, including the alphabet entries, are called character entries. Each entry represents not only one or more extension characters but also the complete character string consisting of the extension characters of the subject entry and the extension characters, concatenated to the left, of all of the ancestors of the subject entry. That character string is called a character symbol. The index of an entry is sometimes called an index symbol. Expansion occurs by taking an index symbol, using it to locate the designated entry, and then outputting the character symbol represented by the entry. The character symbol may be contained in the designated entry, or it may be necessary to proceed upwards through the path of ancestors to collect the extension characters represented by them.

The compression dictionary (as described in U.S. Pat. No. 5,442,350) contains two types of entries: character entry and sibling descriptor entry. The first extension character (EC) represented by any character entry never appears in the entry. For an alphabet entry, the first (and only) EC is implied by the number (index) of the entry. For a nonalphabet entry, the first EC appears as a child character (CC) in the parent of the entry or as a sibling character (SC) in a sibling descriptor that is in the child list (the set of children) of the parent. If an entry represents more than one EC, the ECs after the first are called additional ECs (AECs) and appear in the entry.

A parent contains a child pointer (CPTR) that is the index of its first child. The other children of the same parent, if any, follow the first child contiguously in storage, meaning they have the next higher indexes. If a parent has more children than the number of byte positions available in the parent to contain child characters (CCs), a sibling descriptor follows the last child corresponding to a CC, the sibling descriptor contains the sibling characters (SCs) of the next children, and the next children follow the sibling descriptor. If there are more children than the number of byte positions available in the sibling descriptor to contains SCs, another sibling descriptor follows the children designated by the first sibling descriptor, etc.

The significance of child characters (CCs) and sibling characters (SCs) is that the initial step of attempting to match on a child of a parent can be performed simply by comparing the next character of the input string to each of the CCs in the parent and then the SCs in the sibling descriptors under the parent, without performing storage references to examine the children themselves. However, a child may finally need to be accessed, as will be described. The entries in the compression dictionary (and those in the expansion dictionary) are each eight bytes in length.

FIG. 4 illustrates much of the above description. FIG. 3 is slightly abstract since it does not show count fields and other bits, yet to be described, in the parent entries. FIG. 3 is described as follows. Parent A has children representing the character symbols AAD, ABF, and ACJK. The first extension characters of those children are A, B, and C and appear in the parent as child characters (CCs). AAD has one addition extension character (AEC), D, which appears in the entry. ABF has one AEC, F, which appears in the entry. ACJK has two AECs, JK, that appear in the entry. AAD and ACJK are themselves parents. Entries AADX, AADY, and ACJKZ do not have AECs or children and so contain nothing.

FIG. 5 is a similarly abstract illustration of a sibling descriptor in a child list.

The alphabetical ordering in the figures is only to make the figures easier to read. U.S. Pat. No. 5,442,350 does not require alphabetical ordering.

In the figures to be described next, the brackets around EC or SC indicate that the EC (extension character) or SC (sibling character) may or may not be present, and an ellipsis (three periods) indicates that the preceding field may be repeated.

FIG. 6 shows the three possible actual forms of a character entry in the compression dictionary. Each form begins with a three-bit child-count (CCT) field whose contents indicate the number of child characters (CCs) in the entry and whether a sibling descriptor follows the last child corresponding to a CC. When CCT is zero, the entry can contain zero to four additional extension characters (AECs), with the number of AECs being indicated in the three-bit AEC-count (ACT) field. When CCT is 1, there are a child pointer (CPTR) and one CC in the entry, and the entry can again contain from zero to four AECs. The entry also contains an examine-child bit (X) for the single child. This bit indicates, when one, that if there is a match on the CC, the matching process must be continued by examining (accessing) the child. The bit indicates, when one, that the child has either an AEC or a child, or both.

If there is a match on a CC (or SC) when the corresponding examine-child bit is zero, it is immediately known that the last possible match has been found.

When CCT is greater than 1 in a compression dictionary character entry, the entry can contain zero or one AEC, as indicated by the D (double-character) bit (which is a subset of the ACT field). If D is zero, the entry can contain two to five CCs, and a CCT of 6 indicates both that the entry contains five CCs and that a sibling descriptor follows the fifth child. If D is one, the entry can contain two to four CCs, and a CCT of 5 indicates both that the entry contains four CCs and that a sibling descriptor follows the fourth child. The entry contains an X bit for each of the five possible CCs. The entry also contains two examine-child bits (YY) for the last two children designated by the first sibling descriptor in the child list.

FIG. 7 shows a sibling descriptor. The entry contains a three-bit sibling-count (SCT) field whose contents indicate the number of SCs in the entry and whether another sibling descriptor follows the last child designated by the first sibling descriptor. An SCT of zero indicates that the entry contains seven SCs and that there is another sibling descriptor. The entry contains an examine-child bit (Y) for each of the first five SCs. The Y bits for the last two SCs are in the parent if this is the first sibling descriptor in the child list. If this is not the first sibling descriptor, there are no Y bits for the last two SCs, and the corresponding children must be examined if there is a match on those SCs.

There are two possible forms of a character entry in the expansion dictionary of U.S. Pat. No. 5,442,350, and FIG. 8 shows those two forms. A character entry begins with a three-bit partial-symbol-length (PSL) field whose contents indicate the number of ECs in the entry if the entry does not contain a complete character symbol.

An expansion dictionary character entry is called an unpreceded entry if PSL in it is zero. The entry contains a three-bit complete-symbol-length (CSL) field whose contents indicate the number of ECs in the entry, which can be from one to seven. The entry contains a complete character symbol.

An expansion dictionary character entry is called a preceded entry if PSL is greater than zero. PSL can be from 1 to 5, indicating the number of ECs in the entry. The entry also contains a predecessor pointer (PPTR) and an offset field (OFST). The entry contains either the rightmost or a right-hand part of a character symbol. Given that the next character symbol to be generated by the expansion process is to be placed beginning at a current position in the output area, the ECs from a preceded entry are to be placed at an offset from that current position as indicated by the OFST field in the entry. For example, if the entry contains five ECs and OFST is 255 (its largest possible value), the five ECs are to be placed at an offset of 255 from the current position in the output area (which indicates that the largest possible character symbol is 260 characters). After this placement has been done, the PPTR is used to access the predecessor entry, which may be either another preceded entry or an unpreceded entry. If it is another preceded entry, processing is as for the first one. If it is an unpreceded entry, the ECs in the entry are placed at the current position in the output area. The expansion of an index symbol is concluded when an unpreceded entry has been processed. At this time, if the index symbol designated a preceded entry, the pointer to the current position in the output area is incremented by the sum of the PSL and OFST in that first preceded entry. If the symbol designated an unpreceded entry, the pointer is incremented by the CSL in the entry.

The compression and expansion dictionaries each can contain 0.5K, 1K, 2K, 4K, or 8K entries.

Following is additional detail about the matching process in U.S. Pat. No. 5,442,350. After a match has been found on a parent entry, and if the parent has children, the next character of the string is compared in a left-to-right order against the CCs in the parent and the SCs in the sibling descriptors that are among the children of the parent until a match is found or all CCs and SCs have been compared against. If a match is found, the next characters of the string are compared against the AECs, if any, in the child designated by means of the matched CC or SC. If the AECs match, or if there are no AECs, the matching process is repeated using the matched child as the next parent. If there are AECs that do not match the next characters of the string, then, except in one case, the matching process is ended, with the match on the current parent being the last match. The one exceptional case is when the designated child and also the next child are in a set of children designated by means of consecutive identical CCs (not SCs) beginning with the first CC in the parent. In this case, an attempt is made to match on the following children in the set until either a match is found or all CCs for those children have been compared against.

The effect of the operation just described is that it is useful for two or more identical characters to appear as CCs in a parent or SCs in a sibling descriptor under a parent only when the characters are all consecutive CCs beginning with the first CC in the parent. In any case where the identical characters are not consecutive CCs beginning with the first CC in the parent, the second character and any subsequent identical CC or SC is wasted since they will never be compared against a string character equal to them. The rule that has been described in this paragraph is called the duplicate-CC rule.

The above description of the matching process points out another rule, which is called the AAB-before-AA rule. If parent A has children representing the character symbols AA and AAB, those children must be in the order AAB followed by AA; otherwise, if an input string AAB is matched against, there will always be a match on the AA child, and the AAB child is wasted. The AAB-before-AA rule is illustrated in FIG. 9.

The compression and expansion processing of U.S. Pat. No. 5,442,350 is performed by an instruction named COMPRESSION CALL (CMPSC). CMPSC uses general registers that contain the addresses and lengths of an input area and an output area. It uses another general register, register 1, that contains the address of a compression or expansion dictionary and a compressed data bit number (CBN). The CBN is a three bit number that designates the next bit to be processed within the next byte of the compressed data operand (since an index symbol can begin and end at any bit position within a byte). It uses another general register, register 0, that contains bits indicating whether compression or expansion is to be performed and the number of entries in the dictionary. When performing either compression or expansion, CMPSC processes the contents of the input area and places the results in the output area. CMPSC processes until either the contents of the entire input area have been processed or the output area has become full. CMPSC in effect processes one input record to produce one output record. CMPSC does not recognize or take any action on account of any special kind of end of record (EOR) indicator. This concludes the description of U.S. Pat. No. 5,442,350.

U.S. Pat. No. 5,323,155 to B. Iyer, et al, issued Jun. 21, 1994, entitled "Semi-Static Data Compression/Expansion Method," assigned to the same assignee as the present application, discloses means for determining when, and signalling to the receiving station that (so adaptation can be stopped at the station), a character extension adaptive dictionary is to transformed to a static compression dictionary so as to make use of hardware that compresses in accordance with U.S. Pat. No. 5,442,350. It also discloses a symbol translation means that deals with the requirement in U.S. Pat. No. 5,442,350 that some entries in the static compression dictionary cannot be character entries because they must instead be sibling descriptors, which requirement prevents a simple one-to-one transformation of entries in the adaptive dictionary to entries in the static dictionary.

The use of symbol translation by U.S. Pat. No. 5,323,155 is further explained as follows. Assume that the adaptive dictionary has 4K entries. Each of those entries is equivalent to a character entry, that is, it represents an extension character. (The subject adaptive dictionary uses only character extension, not symbol extension.) When the adaptive dictionary is transformed to one that can be used by the CMPSC instruction, the CMPSC compression dictionary most probably must contain some number of sibling descriptors and, therefore, cannot contain 4K character entries if it is only a 4K-entry dictionary. Therefore, the CMPSC compression dictionary must be an 8K-entry dictionary, with only some small number of entries (equal to the number of sibling descriptors) used within the second set of 4K entries.

For use with U.S. Pat. No. 5,323,155, CMPSC has an option (optional function) named the symbol translation option. The symbol translation option is active when an additional bit in general register 0 is one. When the option is active, the offset of the symbol translation table from the beginning of the dictionary whose address is in general register 1 is also in general register 1. When an index symbol is generated by the matching process when symbol translation is active, the symbol is used by CMPSC as an index into the symbol translation table (containing two-byte entries). The contents of the selected entry in the symbol translation table are then output as the code word that would have been output if the adaptive dictionary were still being used. Those contents are called an interchange symbol. This method of symbol translation is shown in FIG. 10. Symbol translation does not affect the expansion process since, in this example, a 4K-entry expansion dictionary can be formed that will translate an interchange symbol to the correct character symbol.

SUMMARY OF THE INVENTION

It is an object of this invention to perform sort order preserving compression using substantially the same theory as in U.S. Pat. No. 5,270,712 but by means of a dictionary structure constrained as by U.S. Pat. No. 5,442,350 so that both basic compression, as in U.S. Pat. No. 5,442,350 and order-preserving compression, as in U.S. Pat. No. 5,270,712, can be done by substantially the same set of hardware, thus achieving economy of implementation.

It is another object of this invention to make all beneficial features of U.S. Pat. No. 5,442,350 available when doing order-preserving compression, most importantly, the ability of a child to represent multiple extension characters and the ability of a parent to have multiple children all representing the same first extension character. (Those features are ways in which the present invention differs relative to the invention of U.S. Pat. No. 5,270,712, which has a claim step as follows (column 14, line 14): "assigning one said source symbol to each said child node such that all said child nodes are ordered within each said generation according to said ordered source alphabet and no said source symbol appears more than once in any generation." Other differences of the present invention relative to U.S. Pat. No. 5,270,712, but not all differences, are listed subsequently, just before the heading "From Theory to Embodiment.")

It is another object of this invention to minimize the number of any additional entries required in the compression dictionary to do order preserving compression and, thus, to minimize the amount of storage space required by the compression dictionary.

Hereinafter, the method of U.S. Pat. No. 5,442,350 is called the basic compression facility, the symbol translation of U.S. Pat. No. 5,323,155 is called the symbol translation option, and this invention is called the order preservation option.

Definition of the Order Preservation Option:

The basic compression operation (of the basic compression facility) consists of a compression process that produces index symbols and stores the index symbols in the compressed data operand, which is the output area of the COMPRESSION CALL (CMPSC) instruction. When the symbol translation option is specified, the index symbols produced by the compression process are translated to interchange symbols by means of a symbol translation table, and it is the interchange symbols that are stored in the compressed data operand. The expansion process is the same whether or not symbol translation was used during compression.

The order preservation option changes the compression process slightly, and it uses a symbol translation table and produces interchange symbols but changes the symbol translation process slightly. The order preservation option does not affect the expansion process.

The compression process used in the basic compression operation uses what is referred to here as the UNORDERED comparison algorithm: the children of a parent are not considered to be in any particular order, and the next characters from the string being compressed are compared against the extension characters represented by the children in the left-to-right order of the children until either a match is found or all of the children have been processed. (The first part of these comparisons is by means of comparisons to child characters in the parent or sibling characters in sibling descriptors. The second part is by means of comparisons to additional extension characters that may be in the child entries.) The result of the compression process is the index symbol that designates the last matched entry.

The following notes about the use of the unordered algorithm are considered not to contradict the term "unordered":

1. A dictionary building program should place the children of each parent in the order of their frequency of use, but this ordering only improves performance.

2. If, for example, entry A has a first child AA and a second child AAB, the AAB child is a waste because a match will always be found on the AA child before the AAB child is processed. The children must be in the order AAB and AA for AAB to be useful. (See FIG. 9.)

The order preservation option causes the compression process to use an ORDERED comparison algorithm: the children of a parent are considered to be ordered such that the string of one or more extension characters represented by any child is always earlier in the collating sequence than the string of one or more extension characters represented by the next child of the same parent, that is, the children are considered to be in collating sequence order. The next characters from the string being compressed are compared against the extension characters represented by the children in the left-to-right order of the children until any of the following is true:

Comparison Cases:

1. A match is found on an entry without children, or a match is found on an entry with children but there is not another character in the input string;

2. The next characters from the input string have a collating sequence value less than that of the extension characters represented by a child of the last matched parent; or 3. The next characters from the input string have a collating sequence value greater than that of the extension characters represented by the LAST child of the last matched parent.

Case 2 includes the case where the next characters of the string match the leftmost extension characters represented by a child but there are not as many next characters in the string as there are extension characters represented by the child.

Resulting Index Symbol:

The index symbol that results in each of the three comparison cases of the ordered comparison algorithm is as follows:

1. When the comparison process ends because of a match on an entry without children or because of a match on an entry when there is not another character in the input string, the result is the index symbol that designates the entry.

2. When the comparison process ends because the next characters of the input string have a value less than that of the characters represented by a child, the result is the index symbol that designates the child.

3. When the comparison process ends because the next characters of the input string have a value greater than that of the characters represented by the last child, the result is the index symbol that designates the last child.

Implementation Steps:

The ordered comparison algorithm is described in terms of the following implementation steps, which begin at the first child of the null root entry:

1. Test the next characters from the input string for being greater than the extension characters represented by the current child. If the string characters are greater than the characters represented by the child, proceed to the next child and repeat this step. If there is not another child, Case 3 (in the above section "Comparison Cases") is satisfied.

2. If the input string characters are not greater than the extension characters represented by the current child, test them for being equal. If they are equal and the child does not have a child or there is not another character in the input string, Case 1 is satisfied. If they are equal and the child has a child and there is another character in the input string, repeat Step 1 except beginning at the first child of the current child. If the string characters are not equal to the extension characters, they must be less, so Case 2 is satisfied.

Because the same entry might satisfy each of Cases 1, 2, and 3 for different input strings, resulting in production of the same index symbol in each case, the ordered algorithm by itself clearly is not a sufficient mechanism to provide the intended function of the order preservation option; a modified form of symbol translation that produces a correct interchange symbol also is required. This modified form is as follows.

Resulting Interchange Symbol:

The index symbol produced by the compression process is used to locate a symbol translation table entry containing an interchange symbol just as when the symbol translation option is specified. The resulting interchange symbol that is placed in the compressed data operand is then as follows:

1. In Case 1 (in the above section "Comparison Cases"), the interchange symbol that is in the symbol translation table entry.

2. In Case 2, the interchange symbol that is in the symbol translation table entry, minus one; that is, one is subtracted from the value of the interchange symbol that is in the entry to form the interchange symbol that is stored in the compressed data operand.

3. In Case 3, the interchange symbol that is in the symbol translation table entry, plus one; that is, one is added to the value of the interchange symbol that is in the entry to form the interchange symbol that is stored in the compressed data operand.

Although the order preservation option does not affect the expansion process, the expansion dictionary must be formed so that the interchange symbols produced by compression are properly expanded when they are treated as index symbols during expansion. (As when the symbol translation option is specified, an interchange symbol produced during compression is called an index symbol during expansion since there is no symbol translation during expansion.)

During expansion, an index symbol equal to an interchange symbol produced during compression must designate a dictionary entry that represents (possibly by means of preceded entries) the same character symbol as did the last entry that was matched during the compression. In Case 2 or 3, the last matched entry is the parent of the entry that caused the Case 2 or Case 3 condition to be satisfied.

Theory of the Order Preservation Option:

Assume the alphabet consists of only the letter A, B, C, and D, coded as the values (within a byte) 0, 1, 2, and 3 (the values 4–255 are not allowed within a byte), and assume a dictionary as shown in FIG. 11 that has its entries positioned in collating sequence order.

A typical dictionary building program would probably number the entries in FIG. 11 as shown in FIG. 12, in which the entry numbers are the numbers following the colons. (Remember that the basic compression facility requires siblings to be consecutively numbered. Also, it is simpler to assign numbers to the children of an entry before assigning a number to the entry, except that the alphabet entries must be assigned their codes.)

The FIG. 12 dictionary and the basic compression operation do not preserve collating sequence order, as shown by the following examples in which characters or character strings that are compressed as one index symbol are separated by commas and in which the index symbols are separated by commas:

| B, A | 1, 0 |
| BB   | 4    |
| B, C | 1, 2 |

The index symbol string 1,2 is lower in the collating sequence than is 4, but B,C is higher than BB.

In an attempt to do better, FIG. 13 shows the entries numbered in collating sequence order, despite that this numbering is not allowed by the basic compression facility. The above three character strings now, with the FIG. 13 dictionary, can be compressed as follows, which still is not the desired compression:

| B, A | 1, 0 |
| BB   | 2    |
| B, C | 1, 4 |

The problem is solved by introducing epsilon entries between nonadjacent, in the collating sequence, child entries and after the last child entry if it is not highest in the collating sequence. Each epsilon entry represents the character symbol represented by its parent (the parent of the adjacent children) and additionally provides a little more (hence epsilon) information: a direction in the collating sequence relative to the adjacent children. This direction is higher relative to the left-hand adjacent child, and it is lower relative to the right-hand adjacent child if that child exists. FIG. 14 shows the example dictionary with epsilon entries added and the entries renumbered so that all entries are in collating-sequence order.

The above three character strings now can be compressed as follows, which compression preserves the collating sequence order of the input strings:

| B, A | 1, 0 |
| BB   | 2    |
| B, C | 3, 5 |

To demonstrate further that the theory works, FIG. 15 shows a larger set of input strings and their compressed data forms.

The differences between the above theory and that in U.S. Pat. No. 5,270,712 are as follows:

1. The patent assigns numbers to only the leaf nodes of the tree. (Node and entry are synonymous.) The subject invention assigns numbers to all nodes in a dictionary tree, including epsilon nodes, whether or not they are leaf nodes.

2. The patent always requires an epsilon node (called Zilch) before the first child of a parent, even if the first child is lowest in the collating sequence, in which case the node is called an end of record (EOR) node. The subject invention does not have an epsilon node before the first child of a parent.

From Theory to Embodiment:

There are four elements of the embodiment of the order preservation option (the present invention), as follows.

First, although index symbols can be assigned to compression dictionary entries in only a certain way, as constrained by the method of the basic compression facility, symbol translation permits interchange symbols to be assigned to the entries in an arbitrary way. Therefore, the compression dictionary entries can be numbered by means of interchange symbols in collating sequence order.

Second, again because the assignment of interchange symbols can be arbitrary, adjacent children that are not adjacent in the collating sequence can be assigned interchange symbols whose values differ by the amount two instead of one, thus making a value available for assignment to an epsilon entry placed between the two children. An interchange symbol value similarly can be left available for an epsilon entry after the last child of a parent when the last child is not highest in the collating sequence.

Third, the technique used in Cases 2 and 3, above, of subtracting or adding one to the value of the interchange symbol in a symbol translation table entry allows all epsilon entries in the compression dictionary to be imaginary. That is, in the compression dictionary, actual child entries (ones corresponding to child or sibling characters) physically exist and occupy storage, but epsilon entries do not physically exist and do not consume any storage, not even in the symbol translation table. On the other hand, the epsilon entries do physically exist in the expansion dictionary, wherein they represent the character symbols represented by their parents in the compression dictionary.

The fourth element of the embodiment of the order preservation option is a constraint on the compression dictionary imposed by the third element, the subtract-or-add one technique. The constraint is that if the last child of a parent has children and is not highest in the collating sequence, another actual child entry without children must be added on its right.

The dictionary shown in FIG. 14 does not conform to the fourth element. Therefore, although it is theoretically correct, it produces an incorrect result in a certain case. Following are three input strings and their theoretical and actual (because of the subtract-or-add-one technique) compressed data forms:

| Input Strings | Theoretical Interchange Symbols | Actual Interchange Symbols |
| --- | --- | --- |
| D, B | 13, 1 | 13, 1 |
| DCB | 15 | 15 |
| D, D | 17, 11 | 15, 11 |

The 15,11 produced for D,D is wrong because when expanded it will produce DCB,D. The problem is that the number of the epsilon entry cannot be obtained by adding one to the number of the DC entry because the DC entry has a child that is numbered one more than the DC entry. The problem is solved by replacing the epsilon entry with a DD entry as shown in FIG. 16.

The dictionary shown in FIG. 17 is in error for the reason just described: the last actual child of A (which is the only actual child) has a child and is not highest in the collating sequence. A,B would be compressed to 2,4, which then would be expanded to AAA,B.

The A tree of the FIG. 17 dictionary can be corrected to any of the three forms shown in FIG. 18. In FIG. 18, the rightmost correction is poor since it requires an additional epsilon entry. The number of epsilon entries should be minimized since they occupy code points of the interchange symbol range available for compression, and they use storage in the expansion dictionary.

There could be a design in which the AA entry contains a field containing the value that should be added to the interchange symbol corresponding to the AA entry to form the interchange symbol corresponding to the right-hand epsilon entry. The space used by this field would reduce the number of additional extension characters or child characters able to be in the entry. Such a field would reduce performance and complicate the implementation. Adding an actual child without children is simpler and better.

BRIEF DESCRIPTION OF THE DRAWINGS

FIG. 6 shows the actual compression dictionary character entries of U.S. Pat. No. 5,442,350 and has already been described.

FIG. 7 shows the actual sibling descriptor of U.S. Pat. No. 5,442,350 and has already been described.

FIG. 14 shows the FIG. 11 tree with epsilon nodes inserted and the nodes numbered in collating sequence order and has already been described.

FIG. 15 shows the code words resulting from compression of source strings by means of the FIG. 14 dictionary and has already been described.

FIG. 16 shows the FIG. 14 dictionary corrected by replacement of an epsilon entry by a D entry and has already been described.

FIGS. 24A and 24B show the code words resulting from compression of source strings by means of the FIG. 16 dictionary and the FIGS. 23A, 23B, and 23C process.

DETAILED DESCRIPTION OF THE EMBODIMENT

Figure 19:
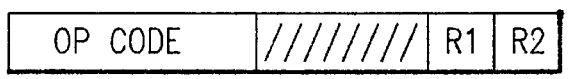
FIG. 19 shows the COMPRESSION CALL (CMPSC) instruction of the preferred embodiment.
Figure 19:
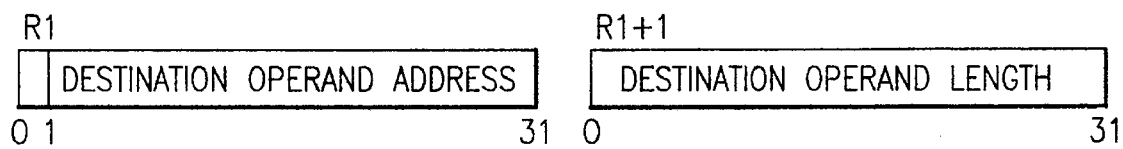
Figure 19:
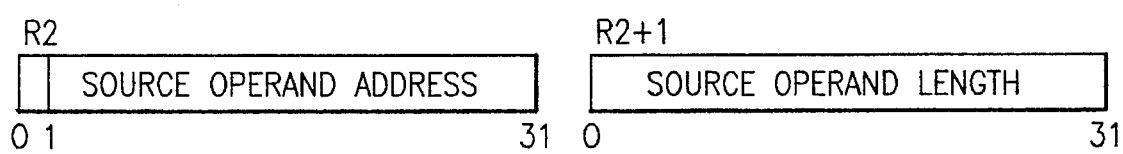
Figure 19:
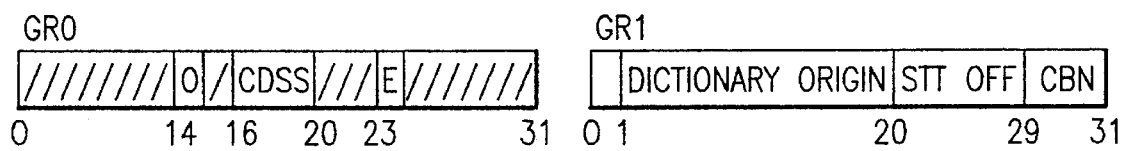

COMPRESSION CALL Instruction—FIG. 19:

The COMPRESSION CALL (CMPSC) instruction was introduced in the discussion of U.S. Pat. No. 5,442,350 and is shown in detail in FIG. 19.

CMPSC has R1 and R2 fields that each designate an even/odd pair of general registers. The R1 (even) and R1+1 (odd) registers contain the address and length, respectively, of the destination (output) operand. The R2 and R2+1 registers contain the address and length, respectively, of the source (input) operand. During compression, the source operand is the uncompressed data, and the compressed data is placed in the destination operand.

During compression when the order preservation option (the present invention) is active, general register 1 contains the origin (high-order address bits appended on the right with zero bits) of the compression dictionary, the high-order bits (appended on the right with zero bits) of an offset from the beginning of the compression dictionary to a symbol translation table, and a three bit compressed data bit number (CBN). The CBN designates the bit position within a byte where the next interchange symbol generated during the compression process is to be stored.

General register 0 contains a bit that specifies whether the operation is to be compression or expansion, a bit that specifies whether the order preservation option is to be active, and bits, named the compressed data symbol size (CDSS), that specify the number of bits that are to be in an interchange symbol, which can be from 9 to 13 bits.

CMPSC ends its execution by setting either condition code 0 (CC0) or condition code 1 (CC1) in a program status word (PSW). CC0 indicates that the entire source operand was compressed. CC1 indicates that the destination operand location became full of compressed data and, therefore, the entire source operand could not be compressed.

When CMPSC ends its execution, it decrements its length registers by the numbers of bytes of the operands that have been processed, and it increments its address registers by the same numbers of bytes. It also updates the CBN to designate the next bit after the last bit of the compressed data operand processed.

Figures 20, 21, 22:
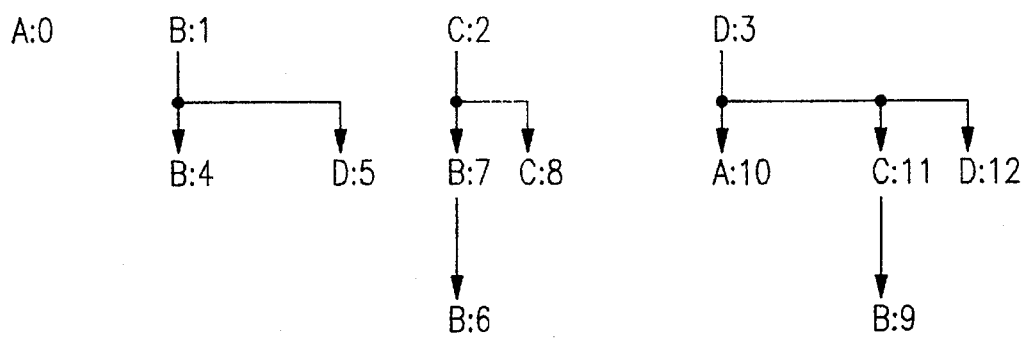
FIG. 20 shows the FIG. 16 dictionary without the imaginary epsilon entries and with the nodes numbered by index symbols instead of interchange symbols.
FIG. 21 shows a symbol translation table that is used, along with an add-or-subtract-one technique, to change the index symbols of FIG. 20 to the interchange symbols of FIG. 16.
FIG. 22 shows the character symbols that correspond to the interchange symbols of the FIG. 16 dictionary, and it shows which of those interchange symbols are assigned to epsilon entries (nodes).

Dictionary Structure—FIG. 20:

FIG. 20 shows a physical (actual) dictionary structure, for use by CMPSC, corresponding to the logical structure shown in FIG. 16. FIG. 20 does not include the imaginary epsilon entries that are in FIG. 16. The entries in FIG. 20 are numbered with index symbols that designate the actual locations of the entries in storage, while the entries in FIG. 16 are numbered with interchange symbols, which are the code words that will be the compressed data.

It should be understood that FIG. 20 is abstract because it is based on an alphabet containing only the symbols A, B, C, and D.

With respect to the previously described AAB-before-AA rule, note that, in a dictionary for performing order preservation, a parent should not have AAB and AA children because AA should not precede AAB because then AAB would be wasted, and AAB must not precede AA because this would violate sort ordering.

Symbol Translation Table—FIG. 21:

FIG. 21 shows the symbol translation table that is used by CMPSC, along with an add-or-subtract-one technique, to translate the index symbols of FIG. 20 to the interchange symbols of FIG. 16.

Interchange Symbols and Character Symbols—FIG. 22:

FIG. 22 shows the character symbols that are represented by the interchange symbols of FIG. 16, and, as a convenience, it shows which of the interchange symbols designate an epsilon entry in FIG. 16.

Interchange symbols generated during compression are called index symbols when they are expanded since there is no symbol translation during expansion. Thus, FIG. 22 shows the character symbols and their corresponding index symbols (indexes) that are represented in an expansion dictionary that is used to expand data compressed by means of the FIG. 20 compression dictionary.

Figure 23A:
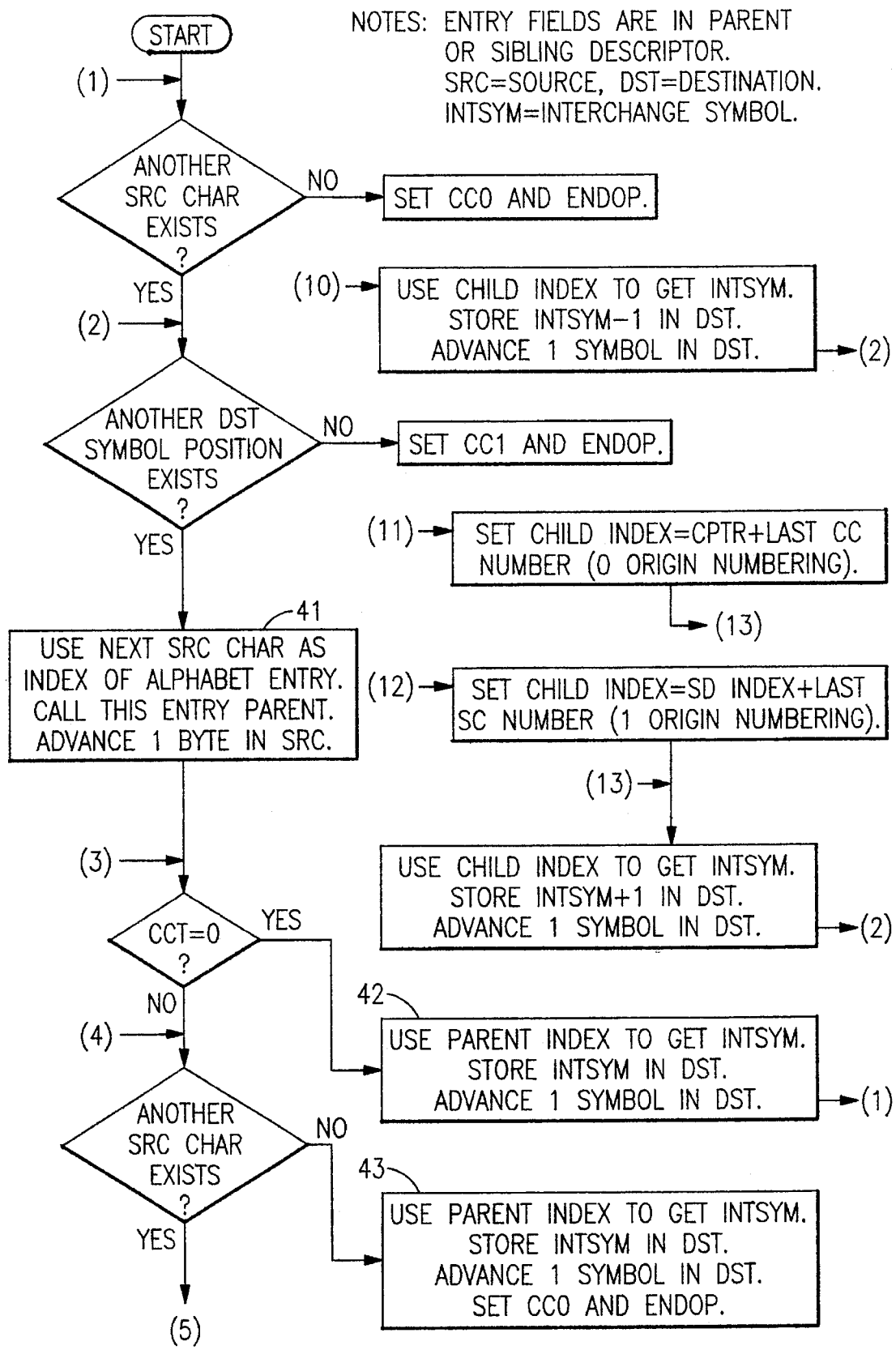
FIGS. 23A, 23B, and 23C show a flow diagram of the compression process of the preferred embodiment.
Figure 23B:
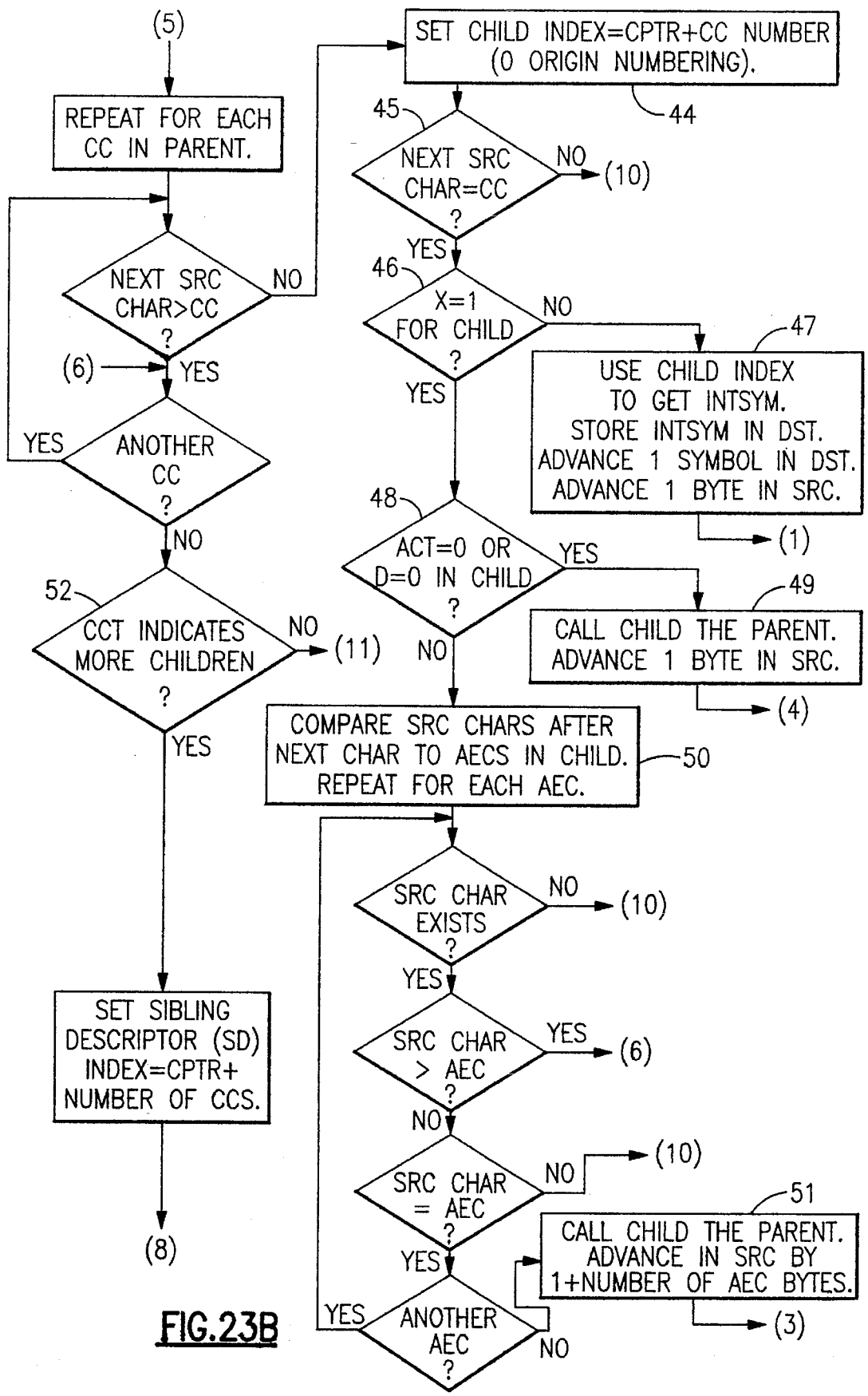
Figure 23C:
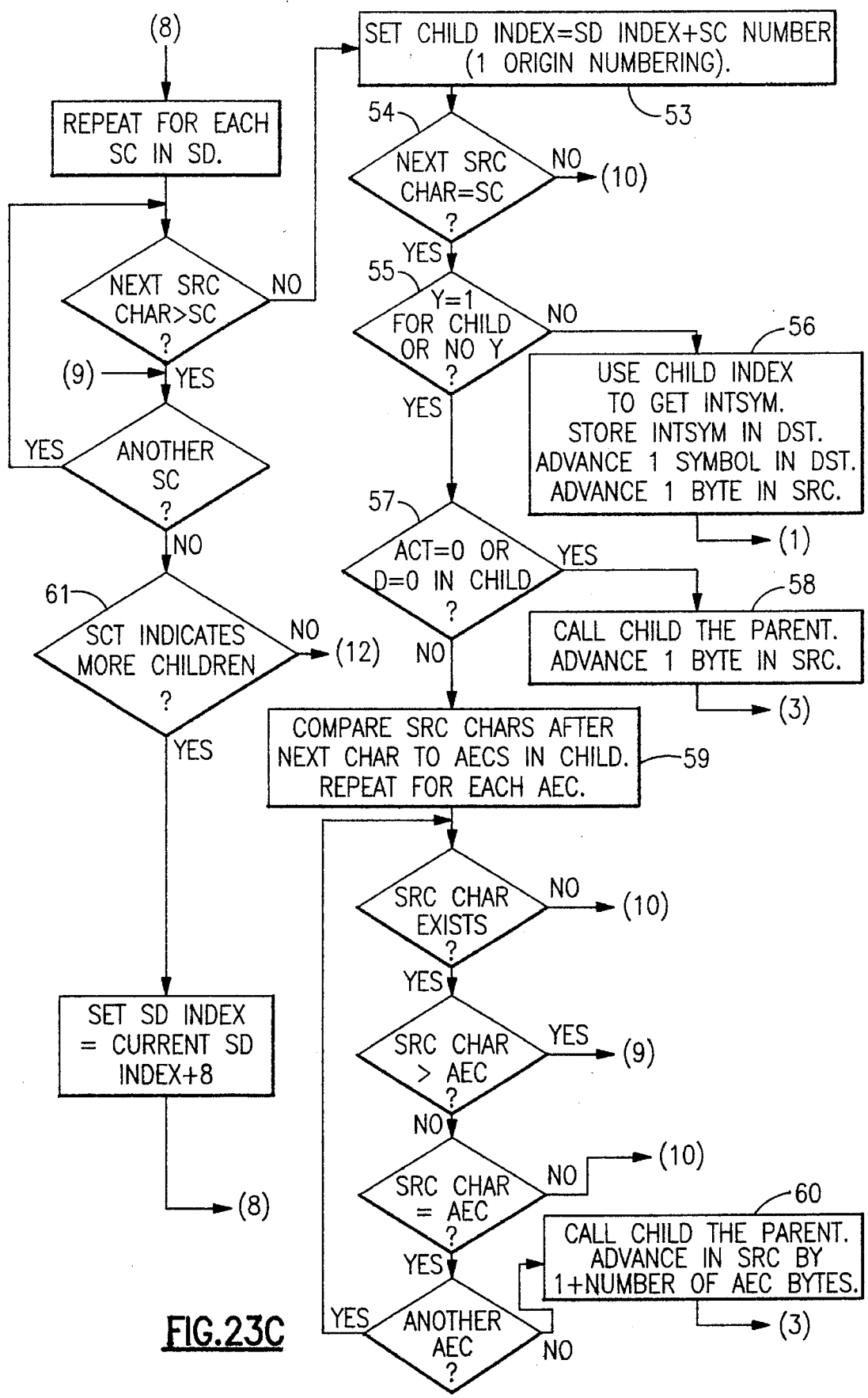

Compression Process—FIGS. 23A, 23B, and 23C:

FIGS. 23A, 23B, and 23C show the order preservation compression process of CMPSC. CMPSC is generally described in connection with FIG. 19. The compression dictionary in FIG. 20 and the symbol translation table in FIG. 21 are examples of structures operated on by the process. The formats of the compression dictionary entries are in FIGS. 6 and 7, which have already been described.

In FIGS. 23A, 23B, and 23C, points within the process to which control may be given from other points within the process are represented by numbers in parentheses, and some steps of the process are numbered for reference within this description by numbers not in parentheses. The process starts at the top of FIG. 23A at (1).

At (1), the length of the source operand, which is in general register R2+1, is tested for being at least one. If it is zero, condition code 0 (CC0) is set, and the execution is ended.

At (2), the length of the destination operand which is in general register R1+1, and the compressed data bit number (CBN), which is in general register 1, are tested for whether the destination operand contains space for at least one interchange symbol. The method of testing can be inferred from the description of Step 42 below. If the destination operand does not contain sufficient space, condition code 1 (CC1) is set, and the execution is ended.

Step 41 uses the character addressed by general register R2 as the index of an alphabet entry in the compression dictionary addressed by the address in general register 1. This entry then is called the parent entry. One is added to the address in register R2, and one is subtracted from the length in register R2+1.

At (3) the child character (CC) count (CCT) in the parent entry is tested for being zero. If it is zero, proceed to Step 42.

Step 42 uses the index of the parent (an index symbol) to locate an entry in the symbol translation table (STT) addressed by the address and offset in general register 1, obtains an interchange symbol from the STT entry, and stores the interchange symbol beginning in the byte addressed by R1 and beginning at the bit position specified by the CBN. The length of the interchange symbol, which is called the compressed data symbol size (CDSS) and is specified by the contents of a field in general register 0, and which can be 9, 10, 11, 12, or 13 bits, is added to the CBN modulo 8 bits, and any carries out of the CBN are added to the address in the R1 register and subtracted from the length in the R1+1 register. For example, if the CBN is initially 5 bits and the CDSS is 13 bits, the sum of 5 and 13 is 18, and the CBN is set to 2 bits, and 2 bytes are added to the address in register R1 and subtracted from the length in register R1+1. Control is then given to (1).

At (4), which is reached when the CCT in the parent is not zero, the source operand is tested for containing another character as at (1). If it does not contain another character, proceed to Step 43.

Step 43 is like Step 42 except that, at the end of Step 43, CC0 is set, and the execution is ended.

At (5), which is reached when there is another source character, a loop is begun in which the next source character is compared to the CCs in the parent beginning with the leftmost CC. If the source character is greater than the CC, then, at (6), the CCT in the parent is tested for indicating another CC, and the loop is repeated if there is another CC.

Step 44, which is reached when the source character is less than or equal to the current CC, sets a child index (the index of the child represented by the CC) equal to the child pointer (CPTR) in the parent plus the number of the CC in the parent, using 0-origin indexing. (The first CC in the parent is numbered 0.)

Step 45 gives control to (10) if the source character is less than the CC.

Step 46, which is reached when the source character is equal to the CC, tests the examine-child (X) bit that is in the parent and that corresponds to the CC. If the X bit is zero, it is known that the child corresponding to the CC does not contain an additional EC (AEC) or have a child, so it is known that the match on the child is the last possible match, and control is given to Step 47.

Step 47 uses the index of the child (an index symbol) to locate an entry in the symbol translation table (STT), obtains an interchange symbol from the STT entry, and stores the interchange symbol beginning in the byte addressed by the R1 register and beginning at the bit position specified by the CBN. The CBN, R1 register, and R1+1 register are then updated as in Step 42, one is added to the address in register R2 and subtracted from the length in register R2+1, and control is given to (1).

Step 48 accesses the child and tests the AEC count (ACT or D) in the child for being zero. If it is zero, it is known that there is a match on the child, so in Step 49 the child becomes the parent, register R2 is incremented by one and register R2+1 is decremented by one, and control is given to (4).

Step 50 begins a loop in which the next source characters are tested for being equal to the AECs in the child. If a next source character corresponding to an AEC does not exist, control is given to (10). Note that the source characters have been found to be less than the extension characters of the child, and, therefore, Case 2, described previously, is satisfied. If the next source character is greater than the AEC, control is given to (6) to test the next child, if any. If the next source character in less than the AEC, control is given to (10). Again, Case 2 is satisfied. If the next source character is equal to the AEC and there is another AEC, the loop is repeated. If there is not another AEC, then there is a match on the child, and, by means of Step 51, the child becomes the parent, register R2 is incremented by one plus the number of AECs, register R2+1 is decremented by one plus the number of AECs, and control is given to (3).

Step 52 is reached when the next source character is greater than all CCs in the parent. If the CCT indicates there are no more children, control is given to (11). Note that the source characters have been found to be greater than the extension characters of the last child, and, therefore, Case 3, described previously is satisfied. If the CCT indicates there are more children, a sibling descriptor (SD) index is set equal to the CPTR in the parent plus the number of CCs in the parent, and control proceeds to (8).

At (8), a loop is begun in which the next source character is compared to the SCs in the SD beginning with the leftmost SC. If the source character is greater than the SC, then, at (9), the SCT in the SD is tested for indicating another SC, and the loop is repeated if there is another SC.

Step 53, which is reached when the source character is less than or equal to the current SC, sets a child index (the index of the child represented by the SC) equal to the SD index plus the number of the SC in the SD, using 1-origin indexing. (The first SC in the SD is numbered 1.)

Step 54 gives control to (10) if the source character is less than the SC.

Step 55, which is reached when the source character is equal to the SC, tests the examine-child (Y) bit that is in the SD (except that the Y bits for SCs 6 and 7 in the first SD are in the parent) and that corresponds to the SC. If the Y bit is zero, it is known that the child corresponding to the SC does not contain an AEC or have a child, so it is known that the match on the child is the last possible match, and control is given to Step 56.

Step 56 is the same as Step 47, with control being given to (1) at the end of the step.

Step 57 is reached when the Y bit for the child either is one or does not exist (because it is for SC 6 or 7 in other than the first SD). Step 57 accesses the child and tests the AEC count (ACT or D) in the child for being zero. If the AEC count is zero, it is known that there is a match on the child, so in Step 58 the child becomes the parent, register R2 is incremented by one and register R2+1 is decremented by one, and control is given to (3). (It is given to (3) instead of (4) because it is not yet known whether the child has a child.)

Step 59 begins a loop in which the next source characters are tested for being equal to the AECs in the child. If a next source character corresponding to an AEC does not exist, control is given to (10) because Case 2 is satisfied. If the next source character is greater than the AEC, control is given to (9) to test the next child, if any. If the next source character in less than the AEC, control is given to (10) because Case 2 is satisfied. If the next source character is equal to the AEC and there is another AEC, the loop is repeated. If there is not another AEC, then there is a match on the child, and, by means of Step 60, the child becomes the parent, register R2 is incremented by one plus the number of AECs, register R2+1 is decremented by one plus the number of AECs, and control is given to (3).

Step 61 is reached when the next source character is greater than all SCs in the SD. If the SCT indicates there are no more children, control is given to (12) because Case 3 is satisfied. Otherwise, the SD index is set equal to the current SD index plus 8 (to address the next SD after one that contained seven SCs), and control is given back to (8).

The step at (10) is reached when Case 2 is satisfied, meaning that the next source characters have been found to be less than the extension characters of a child. The index of the child has already been determined. At (10), the index of the child (an index symbol) is used to locate an entry in the symbol translation table (STT), an interchange symbol is obtained from the STT entry, one is subtracted from the interchange symbol to produce a second interchange symbol, and the second interchange symbol is stored beginning in the byte addressed by the R1 register and beginning at the bit position specified by the CBN. The CBN, R1 register, and R1+1 register are then updated as in Step 42, and control is given to (2) to begin a new matching process using the next source character.

The step at (11) is reached when Case 3 is satisfied by a CC, meaning that the next source characters have been found to be greater than the extension characters of the last child of the parent when that last child is designated by a CC in the parent. At (11), the index of the last child is determined, and then control is given to (13).

The step at (12) is reached when Case 3 is satisfied by an SC, meaning that the next source characters have been found to be greater than the extension characters of the last child of the parent when that last child is designated by an SC in the last SD in the child list of the parent. At (12), the index of the last child is determined, and then control is given to (13).

At (13), the index of the last child (an index symbol) is used to locate an entry in the symbol translation table (STT), an interchange symbol is obtained from the STT entry, one is added to the interchange symbol to produce a second interchange symbol, and the second interchange symbol is stored beginning in the byte addressed by the R1 register and beginning at the bit position specified by the CBN. The CBN, R1 register, and R1+1 register are then updated as in Step 42, and control is given to (2) to begin a new matching process using the next source character.

Figure 1:
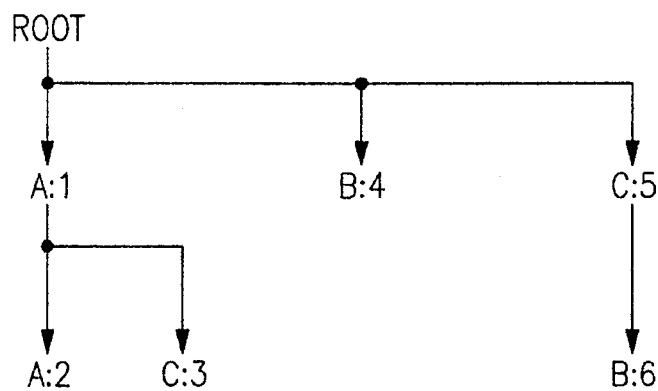
FIG. 1 shows a dictionary tree according to art prior to U.S. Pat. No. 5,270,712 and has already been described.
Figure 2:
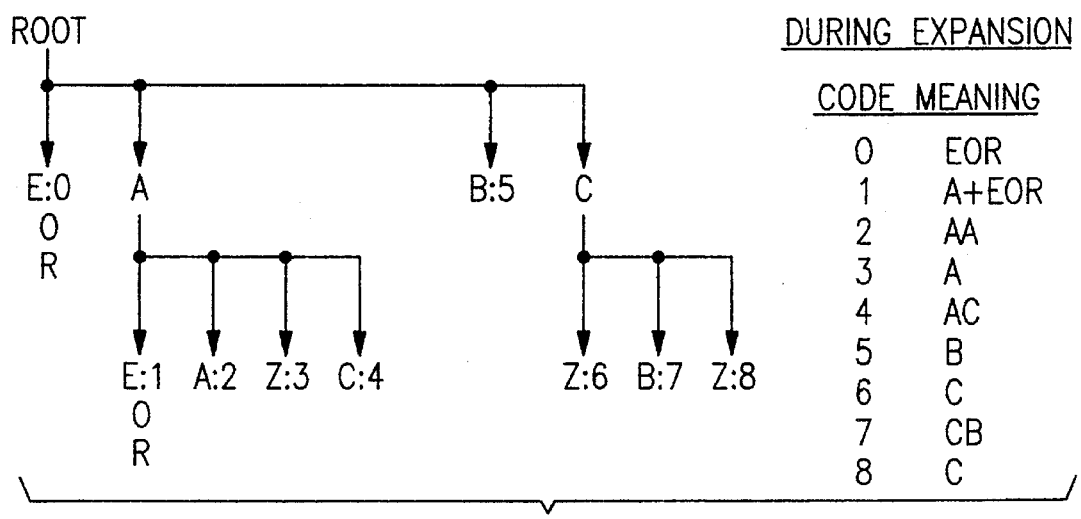
FIG. 2 shows a dictionary tree according to U.S. Pat. No. 5,270,712 and has already been described.
Figures 3, 4:
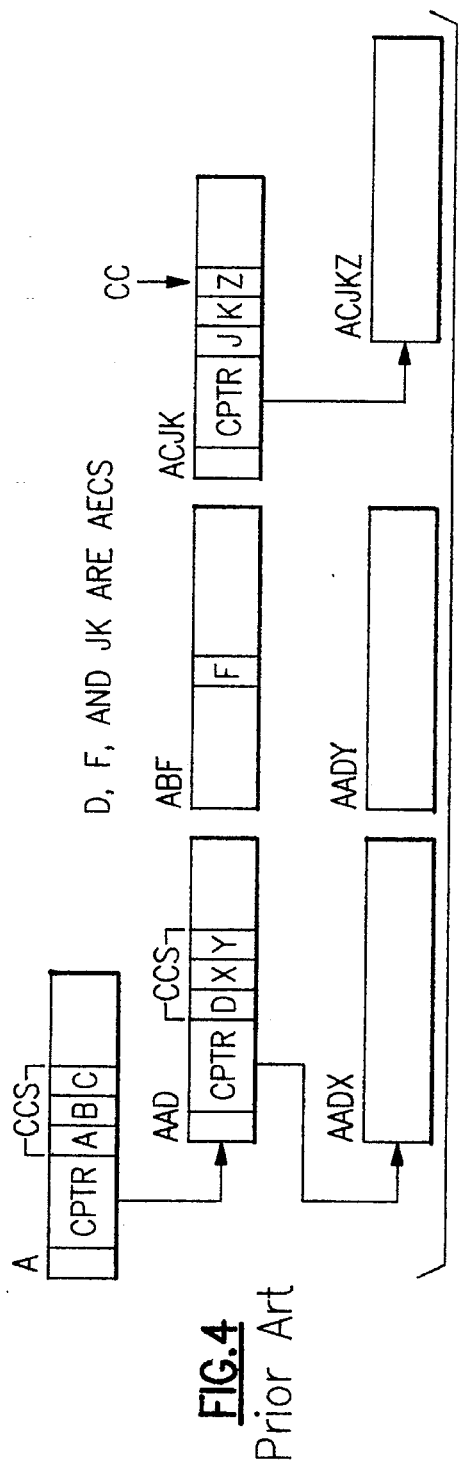
FIG. 3 shows the code words resulting from compression of source strings by means of the FIG. 1 and FIG. 2 dictionaries and has already been described.
FIG. 4 shows an abstraction of the compression dictionary character entries of U.S. Pat. No. 5,442,350 and has already been described.
Figure 5:
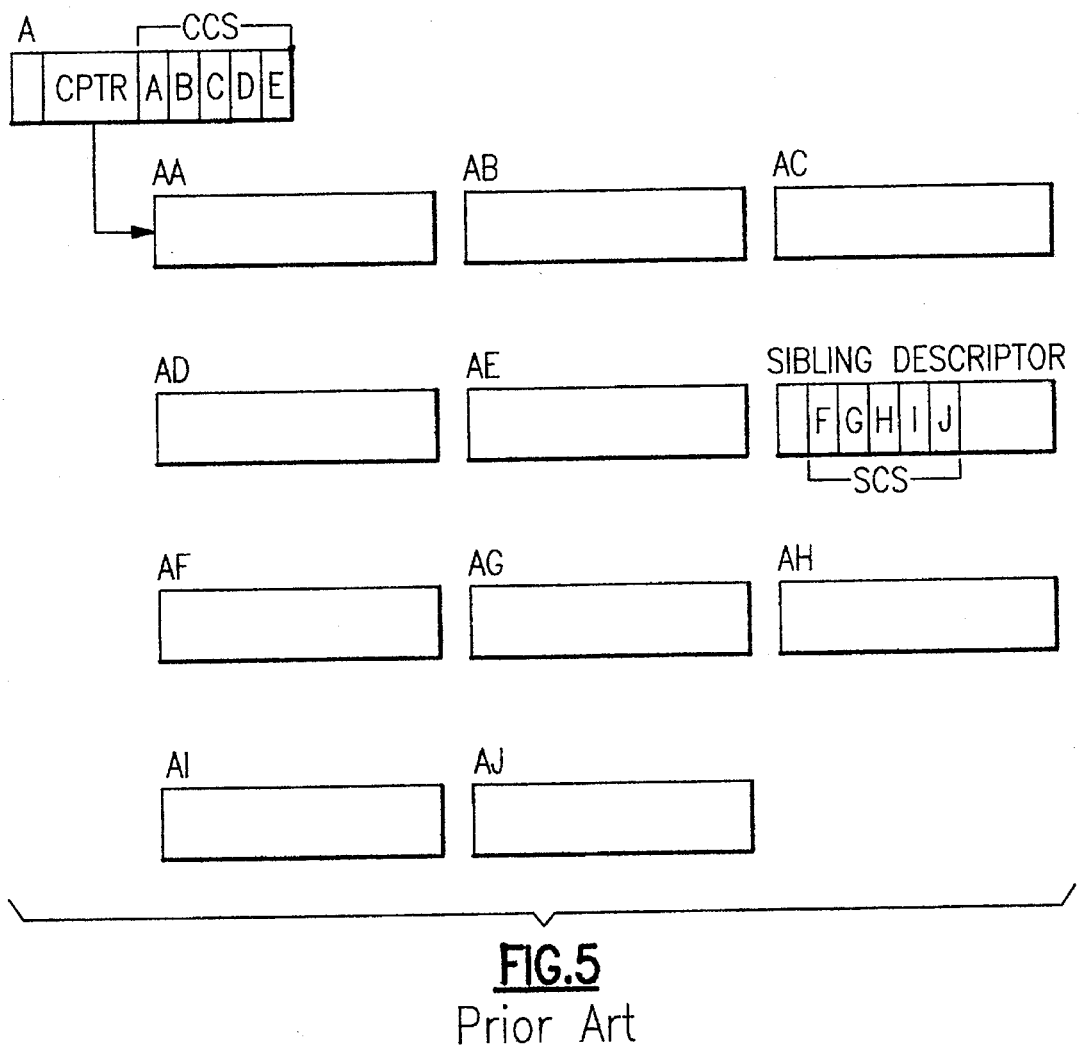
FIG. 5 shows an abstraction of the compression dictionary character entries along with a sibling descriptor of U.S. Pat. No. 5,442,350 and has already been described.
Figure 8:
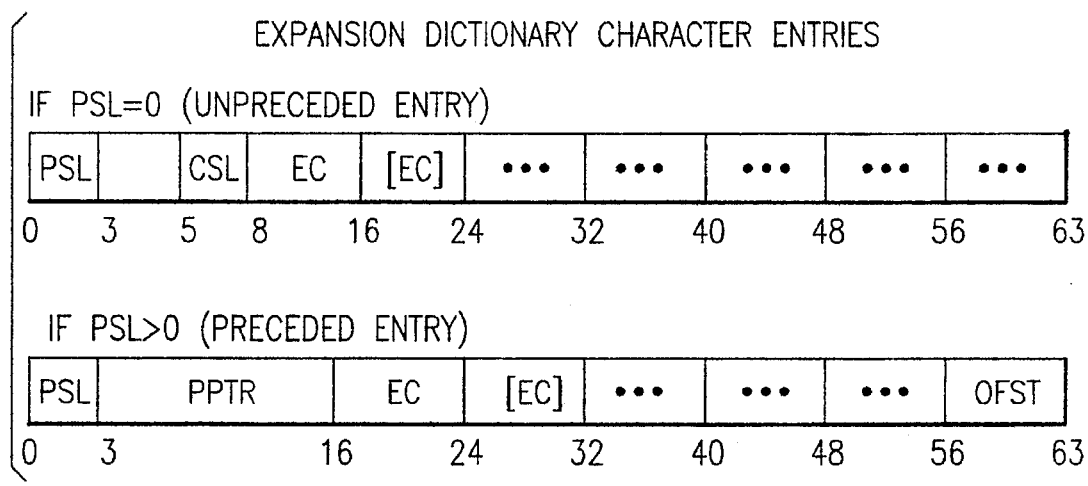
FIG. 8 shows the actual expansion dictionary character entries of U.S. Pat. No. 5,442,350 and has already been described.
Figure 9:
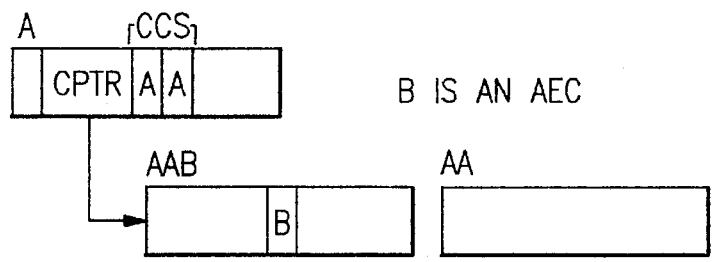
FIG. 9 shows the AAB-before-AA rule of U.S. Pat. No. 5,442,350 and has already been described.
Figure 10:
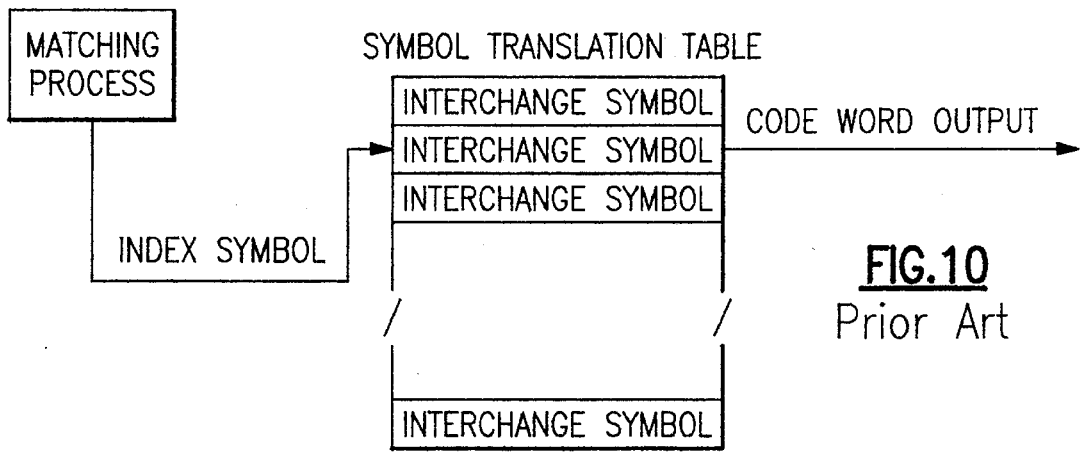
FIG. 10 shows how symbol translation is done by U.S. Pat. No. 5,442,350 along with U.S. Pat. No. 5,323,155 and has already been described.
Figure 11:
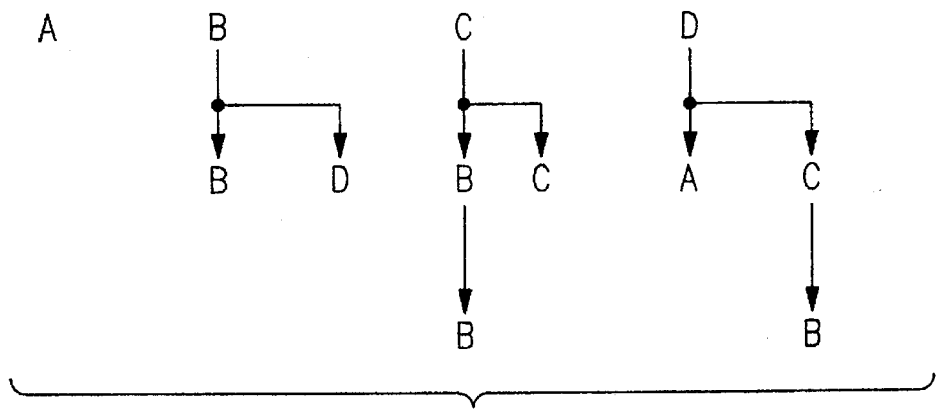
FIG. 11 shows an example compression dictionary tree with the nodes in collating sequence order and has already been described.
Figure 12:
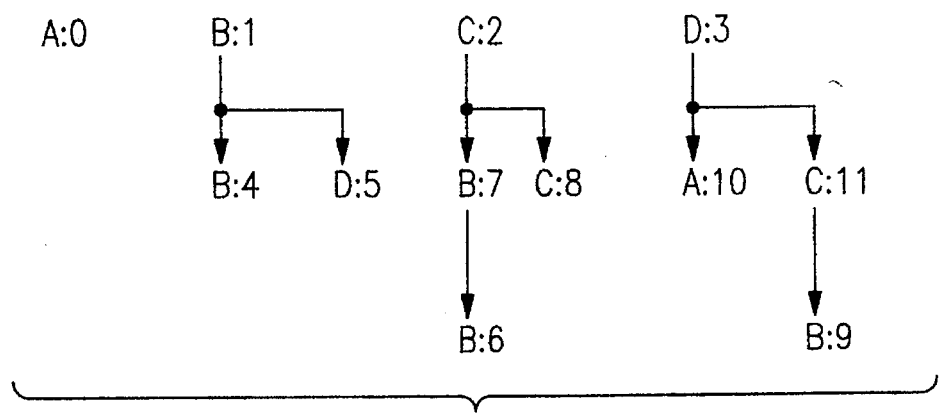
FIG. 12 shows the FIG. 11 tree with the nodes numbered as might be done by a dictionary building program and has already been described.
Figure 13:
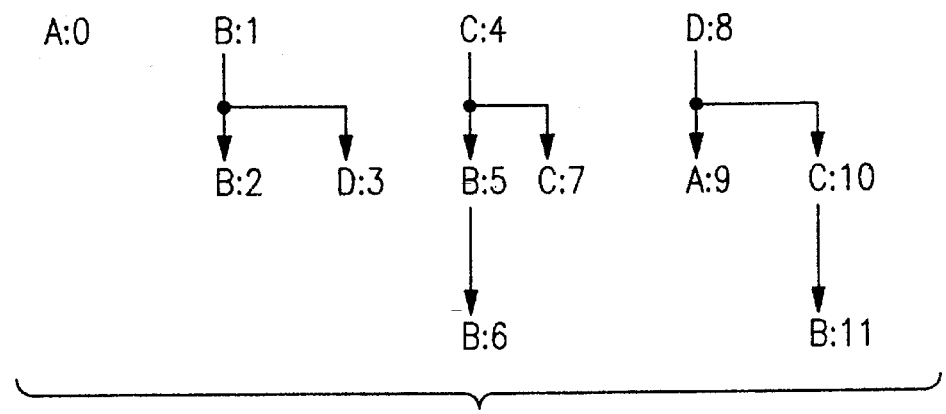
FIG. 13 shows the FIG. 11 tree with the nodes numbered in collating sequence order and has already been described.
Figure 17:
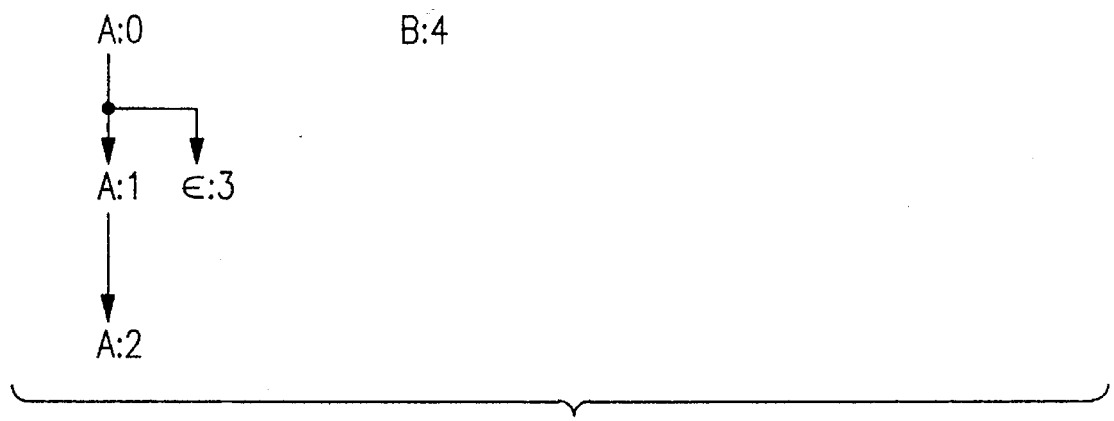
FIG. 17 shows a dictionary erroneous in the same way as the FIG. 14 dictionary and has already been described.
Figure 18:
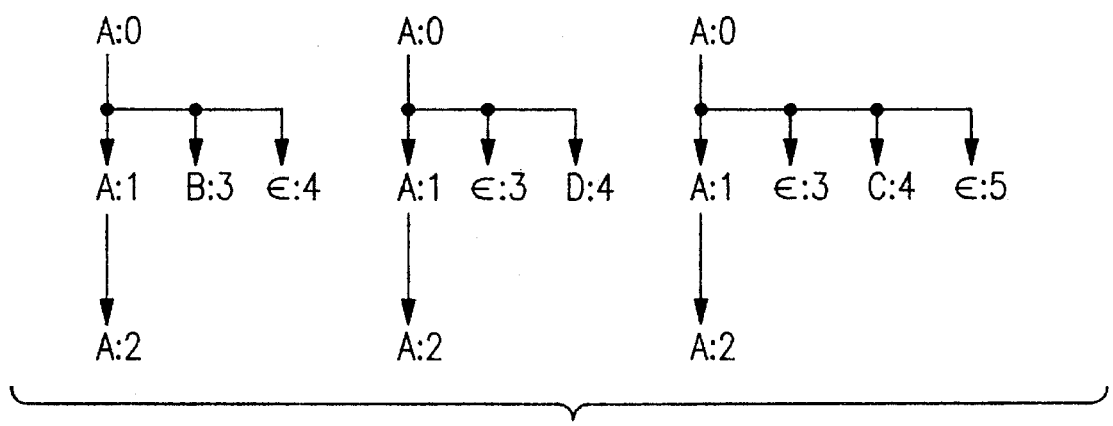
FIG. 18 shows three ways of correcting the A tree of the FIG. 17 dictionary and has already been described.

Source Strings and Code Words—FIGS. 24A and 24B:

FIGS. 24A and 24B show the code words resulting from compression of source strings by means of the FIG. 16 dictionary and the FIGS. 23A, 23B, and 23C process. FIGS. 24A and 24B are like FIG. 15 except that FIGS. 24A and 24B show a more extensive set of source strings and code words (more extensive as in the style of FIG. 3).

If a system that uses compressed data is unable to distinguish between a missing code word and an all zeros code word, then the lowest code word should be assigned a nonzero value. For example, if A and AA result in the code words 0 and 0,0, respectively, as they do in FIG. 24A, with the result that it cannot be recognized that A precedes AA in the collating sequence, then the numbering in FIG. 16 should begin with the number 1, instead of 0, assigned to the A dictionary entry.

While the invention has been described in detail herein, in accordance with certain preferred embodiments thereof, many modifications and changes thereto may be affected by those skilled in the art. Accordingly, it is intended by the appended claims to cover all such modifications and changes as they fall within the true spirit and scope of the invention.

Having thus described my invention, what I claim as new and desire to secure by Letters Patent is:

1. Using a Ziv-Lempel type compression dictionary having actual child entries in a child list under a parent entry, with each actual child entry representing one or more extension characters that are appended on the right of the extension characters represented by the child entry's ancestors up to a null root entry to form a Ziv-Lempel dictionary string of characters, with the child entry also said to represent that string, a method of compressing data and preserving in the compressed data any sort (collating sequence) ordering of the uncompressed data, comprising the steps of:

placing the actual child entries in their sort (collating sequence) order in the child list, as determined by the extension characters represented by the child entries;

inserting a nonactual child entry, called an epsilon entry, in the child list between adjacent actual child entries that are not adjacent in the collating sequence, where two actual child entries are adjacent in the collating sequence if they both represent the same number of extension characters, they both represent the same extension characters except for their last extension characters, and their last extension characters are adjacent in the collating sequence;

placing an epsilon entry after the last actual child entry in the child list if all of the extension characters represented by the last actual child entry are not the same highest character in the collating sequence;

numbering all non-null entries in the dictionary (all entries except the null root entry) so that the numbers are ordered from low to high the same as the collating sequence order of the entries; and compressing an input character string by matching it against a dictionary string composed from actual child entries until a last possible match is found and then outputting a code word by means of a method comprising the steps of:

if a match is found on a dictionary entry not having a child entry or when there is not another input character, outputting the number of the entry;

if the next input character(s) is less than (in the collating sequence) the extension character(s) represented by the first child entry of a parent entry, outputting the number of the parent entry;

if the next input character(s) is less than the extension character(s) represented by other than the first child entry of a parent entry, outputting the number of the epsilon entry that immediately precedes said child entry; or if the next input character(s) is greater than the extension character(s) represented by the last child entry of a parent entry, outputting the number of the epsilon entry that immediately follows said child entry.

2. A method of compressing data and preserving sort ordering as in claim 1, the numbering step further comprising the steps of:

assigning a lowest number to the first child entry (child) of the null root entry, with it being possible that either no number or a still lower number is assigned to the null root entry;

if a child is a parent entry (parent), assigning to the first child of said parent the next higher number after the number assigned to the parent; and if a child is not the first child of its parent, assigning to said child the next higher number after the number assigned to:
the immediately preceding child of the same said parent if that child is not a parent, or
the highest numbered child among all of the descendents of the immediately preceding child of the same said parent, where it should be understood that numbers are assigned to both actual child entries and epsilon entries, and an epsilon entry is never a parent entry.

3. A method of structuring an expansion dictionary for expanding data compressed by the method of claim 1, comprising the steps of:

structuring the expansion dictionary so that a code word that is the number of an actual child entry in the compression dictionary will be expanded to the dictionary string represented by the child entry, and structuring the expansion dictionary so that a code word that is the number of an epsilon entry in the compression dictionary will be expanded to the dictionary string represented by the parent of the epsilon entry.

4. A method of compressing data as in claim 1, further comprising the step of:

if the last actual child entry of a parent entry (a first said parent entry) is a parent entry and does not represent the highest extension character(s) in the collating sequence, adding another actual child entry, which is not a parent entry, after said last actual child entry in the child list of first said parent entry so that the added entry becomes the last actual child entry.

5. A method of compressing data as in claim 1, further comprising the steps of:

omitting all epsilon entries in the compression dictionary and yet still numbering the actual child entries as if the epsilon entries were present;

compressing an input character string by matching it against a dictionary string composed from actual child entries until a last possible match is found and then outputting a code word by means of a method comprising the steps of:

if a match is found on a dictionary entry not having a child entry or when there is not another input character, outputting the number of the entry;

if the next input character(s) is less than (in the collating sequence) the extension character(s) represented by a child entry, outputting a number that is one less than the number of the child entry, where it should be understood that if the child entry is the first child entry of its parent entry, the outputted number will be the number of the parent entry; or if the next input character(s) is greater than the extension character(s) represented by the last child entry of a parent entry, outputting a number that is one more than the number of the child entry.

6. A method of compressing data as in claim 5, further comprising the following steps that begin at the first child entry of the null root entry:

in a first step, test the next input character(s) for being greater than the extension character(s) represented by the child entry, and, if it is greater,
proceed to the next child entry of the same parent entry and repeat the first step, or
if there is not another child entry of the same parent entry, output as a code word the number of the just tested child entry plus one; or in a second step, which is reached when the next input character(s) is not greater than the extension character(s) represented by the child entry, test the input character(s) for being equal to the extension character(s) represented by the child entry, and, if it is equal, if the child entry is not a parent entry or there is not another input character, output as a code word the number of the child entry, or if the child entry (a first said child entry) is a parent entry and there is another input character, repeat the first step except beginning at the first child entry of the first said child entry; or in the second step when the next input character(s) is not equal to the extension character(s) represented by the child entry (in which case the input character must be less than the extension character), output as a code word the number of the child entry minus one.

7. A method of compressing data as in claim 5, further comprising the steps of:

assigning to each compression dictionary actual child entry an index, which is distinct from the previously said number assigned to each entry and which may be indicative of the physical location of the entry in the dictionary;

providing a translation table in which an entry is addressed by means of the index of a compression dictionary actual child entry and contains the number of the actual child entry;

compressing an input character string by matching it against a dictionary string composed from actual child entries until a last possible match is found and then outputting a code word by means of a method comprising the steps of:

if a match is found on a dictionary entry not having a child entry or when there is not another input character, using the index of the dictionary entry to locate a translation table entry and then outputting the number in the translation table entry;

if the next input character(s) is less than (in the collating sequence) the extension character(s) represented by a child entry, using the index of the child entry to locate a translation table entry and then outputting a number that is one less than the number in the translation table entry; or if the next input character(s) is greater than the extension character(s) represented by the last child entry of a parent entry, using the index of the child entry to locate a translation table entry and then outputting a number that is one more than the number in the translation table entry.

8. A method of compressing data as in claim 7, further comprising the following steps that begin at the first child entry of the null root entry:

in a first step, test the next input character(s) for being greater than the extension character(s) represented by the child entry, and, if it is greater, proceed to the next child entry of the same parent entry and repeat the first step, or if there is not another child entry of the same parent entry, use the index of the just tested child entry to locate a translation table entry and then output as a code word the number in the translation table entry plus one; or in a second step, which is reached when the next input character(s) is not greater than the extension character(s) represented by the child entry, test the input character(s) for being equal to the extension character(s) represented by the child entry, and, if it is equal, if the child entry is not a parent entry or there is not another input character, use the index of the child entry to locate a translation table entry and then output as a code word the number in the translation table entry, or if the child entry (a first said child entry) is a parent entry and there is another input character, repeat the first step except beginning at the first child entry of the first said child entry; or in the second step when the next input character(s) is not equal to the extension character(s) represented by the child entry (in which case the input character must be less than the extension character), use the index of the just tested child entry to locate a translation table entry and then output as a code word the number in the translation table entry minus one.

9. A method for enabling ZL (Ziv-Lempel) compressed records to have the same sortability as uncompressed records represented by the compressed records when sorted using a particular character-collating sequence in an alphabet, comprising the steps of:

generating the compressed records as a sequence of indexes representing data strings in a corresponding uncompressed record detected in a static compression dictionary representing a dictionary tree, modifying each index compressed record into a code word compressed record by translating the sequence of indexes into a sequence of code words in a translation table, in which a unique code word is assigned for each index, and the value of each code word:
increasing from left to right in the dictionary tree, and
increasing by one unit for each next child adjacent to another child in the collating sequence, and
increasing by two units for each next child not adjacent in the collating sequence, and expanding each compressed record by using a conventional ZL character expansion process on the compressed record represented as a sequence of code words.

10. A method for enabling compressed records to have the same sortability as uncompressed records as defined by the method in claim 9, further comprising the step of:

inserting code words not found in the translation table into the sequence of code words comprising the compressed record by changing the value of code words currently-located in the translation table for inputted characters not found in the dictionary, a changed code word not being found in the translation table and being designated as epsilon code words for placement in a sequence of code words comprising a compressed record.

11. A method for enabling compressed records to have the same sortability as uncompressed records as defined by the method in claim 10, the inserting step further comprising:

adding a unit to the value of a last-located code word for a currently inputted character of an input string not found in the dictionary when the currently inputted character is greater than the last-located character in the dictionary to generate an epsilon code word for representing the currently inputted character string in a compressed record, and outputting the epsilon code word into a compressed record area as a next code word in a sequence of code words being generated as the compressed record for the uncompressed record providing the currently inputted character string.

12. A method for enabling compressed records to have the same sortability as uncompressed records as defined by the method in claim 10, the inserting step further comprising:

subtracting a unit from the value of a last-located code word for a currently inputted character of an input string not found in the dictionary when the currently inputted character is less than the last-located character in the dictionary to generate an epsilon code word for representing the currently inputted character string in a compressed record, and outputting the epsilon code word into a compressed record area as a next code word in a sequence of code words being generated as the compressed record for the uncompressed record providing the currently inputted character string.

13. A method for enabling compressed records to have the same sortability as uncompressed records as defined by the method in claim 10, the inserting step further comprising:

outputting into a compressed record area the value of a last-located code word for a currently inputted character of an input string found in the dictionary when the currently inputted character is equal to the last-located character to generate a code word for representing the currently inputted character string in a compressed record.

14. A method for enabling compressed records to have the same sortability as uncompressed records as defined by the method in claim 9, further comprising the step of:

including the translation table in a static index dictionary used for compressing the uncompressed records into corresponding compressed records.

15. A method for enabling compressed records to have the same sortability as uncompressed records as defined by the method in claim 14, in which the including step further comprises the step of:

structuring the static compression dictionary with indexed entries having fields for containing the code words assigned to the indexed entries to enable outputting of code words directly from the dictionary for input strings determined from the dictionary.

* * * * *